(12) United States Patent
Faber

(10) Patent No.: US 12,037,142 B2
(45) Date of Patent: Jul. 16, 2024

(54) ENCLOSURES FOR FACILITATING ACTIVITIES IN SPACE, AND ASSOCIATED SYSTEMS AND METHODS

(71) Applicant: Space Arena, Inc., Cupertino, CA (US)

(72) Inventor: Daniel Faber, Cupertino, CA (US)

(73) Assignee: Space Arena, Inc., Cupertino, CA (US)

( * ) Notice: Subject to any disclaimer, the term of this patent is extended or adjusted under 35 U.S.C. 154(b) by 0 days.

(21) Appl. No.: 17/669,094

(22) Filed: Feb. 10, 2022

(65) Prior Publication Data

US 2022/0371751 A1 Nov. 24, 2022

Related U.S. Application Data

(63) Continuation of application No. 16/127,111, filed on Sep. 10, 2018, now Pat. No. 11,273,932.
(Continued)

(51) Int. Cl.
*B64G 1/24* (2006.01)
*A63B 71/02* (2006.01)
(Continued)

(52) U.S. Cl.
CPC .............. *B64G 1/242* (2013.01); *A63B 71/02* (2013.01); *B64C 39/024* (2013.01); *B64G 1/646* (2013.01);
(Continued)

(58) Field of Classification Search
CPC ........ B64G 1/242; B64G 1/646; B64G 1/283; B64G 1/36; B64G 1/361; B64G 1/363;
(Continued)

(56) References Cited

U.S. PATENT DOCUMENTS 3,700,193 A * 10/1972 Bradley .................. B64G 1/14
244/159.3
3,827,599 A 8/1974 Rastogi
(Continued)

FOREIGN PATENT DOCUMENTS

CA 2473981 1/2006
CA 3132561 9/2020
(Continued)

OTHER PUBLICATIONS

"Reference Guide to the Space Station International", NASA (Year: 2015).*
(Continued)

*Primary Examiner* — Assres H Woldemaryam
(74) *Attorney, Agent, or Firm* — Perkins Coie LLP

(57) ABSTRACT

Enclosures for facilitating activities in space, and associated systems and methods, are disclosed. A representative system includes a spacecraft having an enclosed interior volume (which can be formed by an inflatable membrane) and one or more unmanned aerial vehicles (UAVs) carried by the spacecraft and positioned to deploy into the enclosed interior volume. The system can include a remote-control system to control the one or more UAVs from a terrestrial location while the spacecraft is in space. A wireless charging system can provide electrical power to the one or more UAVs. A representative method includes configuring one or more controllers to launch a first spacecraft to a first orbit, launch a second spacecraft to a second orbit, move the first spacecraft to the second orbit, dock the first spacecraft with the second spacecraft, and broadcast an event within an interior volume of the first spacecraft to a terrestrial location.

18 Claims, 6 Drawing Sheets

Related U.S. Application Data

(60) Provisional application No. 62/595,238, filed on Dec. 6, 2017, provisional application No. 62/556,468, filed on Sep. 10, 2017.

(51) Int. Cl.
| | | |
|---|---|---|
| *B64C 39/02* | (2023.01) | |
| *B64G 1/64* | (2006.01) | |
| *H01L 23/60* | (2006.01) | |
| *B64U 50/19* | (2023.01) | |
| *B64U 50/34* | (2023.01) | |
| *B64U 101/00* | (2023.01) | |

(52) U.S. Cl.
CPC .............. *H01L 23/60* (2013.01); *B64U 50/19* (2023.01); *B64U 50/34* (2023.01); *B64U 2101/00* (2023.01); *B64U 2201/20* (2023.01)

(58) Field of Classification Search
CPC .......... B64G 1/365; B64G 1/366; B64G 1/68; B64G 1/428; B64G 2001/224; B64G 1/005; B64G 1/12; B64G 1/222; B64G 1/26; B64G 1/54; B64G 1/60; A63B 71/02; B64C 39/024; H01L 23/60; B64U 50/19; B64U 50/34; B64U 2101/00; B64U 2201/20
See application file for complete search history.

(56) References Cited

U.S. PATENT DOCUMENTS

| | | |
|---|---|---|
| 3,854,905 A | 12/1974 | Balzer |
| 3,931,834 A | 1/1976 | Caillet |
| 4,451,017 A | 5/1984 | Marshall |
| 4,471,926 A | 9/1984 | Steel |
| 4,489,745 A | 12/1984 | Netter |
| 4,705,546 A | 11/1987 | Bruns |
| 4,728,061 A | 3/1988 | Johnson et al. |
| 4,741,502 A | 5/1988 | Rosen |
| 4,796,839 A | 1/1989 | Davis |
| 4,872,625 A | 10/1989 | Filley |
| 4,903,919 A | 2/1990 | Johnson |
| 5,145,130 A | 9/1992 | Purves |
| 5,202,165 A | 4/1993 | Lusignea |
| 5,217,187 A | 6/1993 | Criswell |
| 5,299,764 A | 4/1994 | Scott |
| 5,427,334 A | 6/1995 | Rauscher, Jr. |
| 5,545,841 A | 8/1996 | Wilifinger |
| 5,778,679 A | 7/1998 | Celorier, Jr. |
| 5,913,451 A | 6/1999 | Madison |
| 5,920,294 A | 7/1999 | Allen |
| 5,979,481 A | 11/1999 | Ayresman |
| 6,231,010 B1 | 5/2001 | Schneider et al. |
| 6,264,144 B1 | 7/2001 | Thorton |
| 6,290,820 B1 | 9/2001 | Carden |
| 6,293,500 B1 | 9/2001 | Bigelow |
| 6,393,675 B1 | 5/2002 | Gaetke |
| 6,439,508 B1 | 8/2002 | Taylor |
| 6,514,889 B1 | 2/2003 | Theoret et al. |
| 6,523,402 B1 | 2/2003 | Hall et al. |
| 6,669,148 B2 * | 12/2003 | Anderman ............. B64G 1/007 244/172.4 |
| 7,070,151 B2 * | 7/2006 | D'Ausilio ............. B64G 1/646 244/171.1 |
| 7,114,682 B1 | 10/2006 | Kistler |
| 7,392,964 B1 | 7/2008 | Anderman |
| 7,559,508 B1 | 7/2009 | Taylor et al. |
| 7,861,884 B2 | 1/2011 | Childress |
| 8,006,937 B1 | 8/2011 | Romano et al. |
| 9,056,676 B1 | 6/2015 | Wang |
| 9,231,323 B1 | 1/2016 | Jaeger |
| 9,302,793 B2 * | 4/2016 | Ghofranian ............. B64G 1/222 |
| 9,439,092 B1 | 9/2016 | Chukka |
| 9,613,539 B1 * | 4/2017 | Lindskog ............. G08G 5/0069 |
| 9,718,564 B1 | 8/2017 | Beckman |
| 10,106,029 B2 | 10/2018 | Aso |
| 10,211,674 B1 | 2/2019 | Leabman |
| 10,302,053 B2 | 5/2019 | Aso |
| 10,308,125 B2 | 6/2019 | Ahrens |
| 10,513,352 B2 | 12/2019 | Poncet et al. |
| 10,577,133 B2 * | 3/2020 | White, Jr. ............. B64G 1/405 |
| 10,604,281 B2 | 3/2020 | Raven et al. |
| 10,654,584 B2 | 5/2020 | Bosma |
| 10,807,782 B2 | 10/2020 | Snafilippo |
| 10,822,155 B2 | 11/2020 | Khomenko |
| 11,273,932 B2 | 3/2022 | Faber |
| 2002/0047016 A1 | 4/2002 | Ishikawa |
| 2002/0092854 A1 | 7/2002 | Aaron |
| 2002/0179775 A1 | 12/2002 | Turner |
| 2004/0026571 A1 | 2/2004 | Scott |
| 2004/0031885 A1 | 2/2004 | D'Ausilio et al. |
| 2005/0017016 A1 | 1/2005 | Lombari |
| 2006/0145023 A1 | 7/2006 | Babb et al. |
| 2006/0145024 A1 | 7/2006 | Kosmas |
| 2006/0278765 A1 | 12/2006 | Strack |
| 2007/0051854 A1 | 3/2007 | Behrens et al. |
| 2007/0228219 A1 | 10/2007 | Behrens |
| 2007/0228220 A1 * | 10/2007 | Behrens ................ B64G 1/646 244/172.5 |
| 2008/0087769 A1 | 4/2008 | Johnson |
| 2009/0173833 A1 | 7/2009 | Ritter et al. |
| 2010/0006704 A1 | 1/2010 | Sainct |
| 2012/0000575 A1 | 1/2012 | Yandle |
| 2012/0080438 A1 | 4/2012 | Beretta |
| 2012/0097532 A1 | 4/2012 | DeLuze |
| 2014/0348140 A1 | 11/2014 | Atkinson |
| 2015/0236778 A1 | 8/2015 | Jalali |
| 2016/0207641 A1 | 7/2016 | Myers |
| 2016/0257432 A1 | 9/2016 | Shmueli |
| 2016/0361992 A1 | 12/2016 | Aso |
| 2016/0364989 A1 | 12/2016 | Speasl et al. |
| 2017/0173451 A1 | 6/2017 | Pedersen |
| 2018/0086456 A1 | 3/2018 | Burch et al. |
| 2018/0098780 A1 | 4/2018 | Melton et al. |
| 2019/0023420 A1 | 1/2019 | Nicholson |
| 2019/0023422 A1 | 1/2019 | Nicholson |
| 2019/0077523 A1 | 3/2019 | Faber et al. |
| 2019/0077524 A1 | 3/2019 | Faber et al. |
| 2019/0135456 A1 | 5/2019 | Wingo |
| 2019/0247050 A1 | 8/2019 | Goldsmith |
| 2020/0049114 A1 | 2/2020 | O'Connor |
| 2020/0346781 A1 | 11/2020 | Bosma |
| 2021/0061494 A1 | 3/2021 | Belieres Montero |
| 2021/0070465 A1 | 3/2021 | Bosma |
| 2021/0086923 A1 | 3/2021 | Halsband et al. |
| 2021/0300597 A1 | 9/2021 | Clark |
| 2022/0259746 A1 | 8/2022 | Wang et al. |
| 2023/0365275 A1 | 11/2023 | Nicholson |

FOREIGN PATENT DOCUMENTS

| | | |
|---|---|---|
| CN | 201445801 | 5/2010 |
| DE | 4242977 | 6/1994 |
| DE | 102011009952 | 8/2012 |
| EP | 2143640 | 1/2010 |
| GB | 2264684 | 9/1993 |
| WO | 2008066512 | 6/2008 |
| WO | 2014021741 | 2/2014 |
| WO | 2016020390 | 2/2016 |
| WO | 2019051423 | 3/2019 |
| WO | 2019051432 | 3/2019 |

OTHER PUBLICATIONS

"There's a Drone Flying Around the International Space Station—And It's Adorable", Photography (Year: 2017).*

Dan Hentschel, NASA Water Balloons in Zero G (High Quality), YouTube (Oct. 18, 2009), URL: https://www.youtube.com/watch?v=gTqLQO3L4Ko.

TV Addict, NASA: Amazing Experiments with Water in Zero Gravity, YouTube (Aug. 1, 2012), URL: https://www.youtube.com/watch?v=ntQ7qGilqZE.

(56) References Cited

OTHER PUBLICATIONS

CoconutScienceLab, Wringing out a Water Soaked Washcloth in Space | CSA Science HD Video, YouTube (Apr. 17, 2013), URL: https://www.youtube.com/watch?v=KFPvdNbftOY.
CoconutScienceLab, Yuck! Water Sticks to an Astronaut's Face | Video, YouTube (Aug. 11, 2017), URL: https://www.youtube.com/watch?v=iNzI9SGtaHY.
CoconutScienceLab, Tim Peake's "Weightless Fun" Chat With Liverpool Students | Video, YouTube (Feb. 4, 2016), URL: https://www.youtube.com/watch?v=8fWfErpNX90.
CoconutScienceLab, Space Physics: The Science of Liquid Spheres in Zero Gravity | NASA ISS Microgravity Video, YouTube (Jul. 31, 2012), URL: https://www.youtube.com/watch?v=jn5KuSHguUE.
CoconutScienceLab, Water Sloshing on the Space Station | Video, YouTube (Feb. 7, 2017), URL: https://www.youtube.com/watch?v=16PiWpTektg.
Unbelieavblevids, The fire in space—space candle, YouTube (Jan. 23, 2014), URL: https://www.youtube.com/watch?v=Gecui7ygtjY.
Seeker, How Fire Burns in Space, YouTube (Nov. 11, 2013), URL: https://www.youtube.com/watch?v=9zdD7IfBOFs.
VideoFromSpace, Spinning Fast in Space Make You Dizzy? Astronaut Experiment | Video, YouTube (Jun. 13, 2016), URL: https://www.youtube.com/watch?v=GPnLShiJ-t4.
Documentary Tube, How It Works: The International Space Station, YouTube (Jul. 3, 2015), URL: https://www.youtube.com/watch?v=SGP6Y0Pnhe4.
Greater Earth, Cosmic Dancer on the Mir Space Station—Space Art in Earth Orbit, YouTube (Jan. 30, 2012), URL: https://www.youtube.com/watch?v=-RsBoftdVLc.
Greater.Earth, cosmic dancer 2016, YouTube (Jun. 14, 2016), URL: https://www.youtube.com/watch?v=LRqRZfvjaPk.
Greater Earth, Cosmic Dancer on the Mir space station, YouTube (Jan. 27, 2012), URL: https://www.youtube.com/watch?v=ivniZUACSQY.
NASA, Angry Birds & Pigs Go Weightless !!!, YouTube (Mar. 8, 2012), URL: https://www.youtube.com/watch?v=deAcVKv5_2l.
Veritasium, Fire in ZERO-G!!, YouTube (May 3, 2017), URL: https://www.youtube.com/watch?v=xdJwG_9kF8s.
MrZurkon00, LSBU Concept for Sports in Space via Virgin Galactic, YouTube (May 31, 2012), URL: https://www.youtube.com/watch?v=klwBdyN6zFY.
Sony | Camera Channel, ZeroG | Tony Hawk and Aaron "Jaws" Homoki | Sony, YouTube (May 26, 2016), URL: https://www.youtube.com/watch?v=Z0nHSMM_69w.
OK Go, OK Go—Upside Down & Inside Out, YouTube (Feb. 13, 2016), URL: https://www.youtube.com/watch?v=LWGJA9i18Co.
Curiosity's Seven Minutes of Terror, NASA Jet Propulsion Laboratory California Institute of Technology, Jun. 22, 2012. URL: https://web.archive.org/web/20190911033522/https://www.jpl.nasa.gov/video/details.php?id=1090.
Onat Karyağmaz, Future Sports—Space Diving, YouTube (Oct. 9, 2011), URL: https://www.youtube.com/watch?v=mWxHuR-3fml.
Oculus, Echo Arena—Experience esports in Zero-G, YouTube (Jun. 12, 2017), URL: https://www.youtube.com/watch?v=5xPRIocr8ts.
Gamermusclevideos, Echo Arena Review—The Good The Bad & Why You Should Play It Now, YouTube (Jul. 18, 2017), URL: https://www.youtube.com/watch?v=yzsFgDxzWIk#t=685.073937.
Gamespot, LawBreakers PS4 Reveal Trailer, YouTube (May 22, 2017), URL: https://www.youtube.com/watch?v=fIEFp4VZGU4&feature=youtu.be.
Thearchitectsrepublic, SUMOCRATS teaser alpha, YouTube (Mar. 28, 2017), URL: https://www.youtube.com/watch?v=bZK5V4c-tcw.
Søren Trautner Madsen, Zero-G greenlight Trailer, YouTube (Jul. 3, 2016), URL: https://www.youtube.com/watch?v=2JsnYGBBP3E.
Zero G Arena, Zero G Arena Greenlight Trailer, YouTube (Apr. 12, 2016), URL: https://www.youtube.com/watch?v=MwAfqyS1ylw.
Taurtis, Ragdoll Warfare!—Zero G Arena, YouTube (Aug. 26, 2016), URL: https://www.youtube.com/watch?v=8uqhNhM5_uQ.
International Search Report and Written Opinion for International Patent Application No. PCT/US18/50286, Applicant: Orbit Fab, Inc., mailed Jan. 29, 2019, 24 pages.
Valle et al., "Review of Habitable Softgoods Inflatable Design, Analysis, Testing, and Potential Space Applications," American Institute of Aeronautics and Astronautics, available at: https://ntrs.nasa.gov/citations/20190000847, published: Jan. 7, 2019, 15 pages.
Inflatable Emergency Atmospheric-Entry Vehicles, Tech Briefs Engineering Solutions for Design and Manufacturing, Aug. 1, 2004, 4 pages.
Wayback "Maneuvering in Space" 2017, 2 pages.
FAA, "Maneuvering in Space 4.1.5." available at: https://web.archive.org/web/20170613043041/https://www.faa.gov/about/office_org/headquarters_offices/avs/offices/aam/cami/library/online_libraries/aerospace_medicine/tutorial/media/III.4.1.5_Maneuvering_in_Space.pdf, 2017 pages, 32 pages.
Dancila, "A MEMS variable Faraday cage as tuning element for integrated silicon micromachines cavity resonators," IEEE International Conference on Micro Electro Mechanical Systems (MEMS), Feb. 2010, 5 pages.
Shirazi, "Analysis of a Hybrid Genetic Simulated Annealing Strategy Applied in Multi-Objective Optimization of Orbital Maneuvers," IEEE A&E Systems Magazine, Jan. 2017, 17 pages.
CUBESAT—California Polytechnic State University, 6U CubeSat Design Specification Revision 1.0 (CP-6UCDS-1.0) The CubeStat Program, Cal Poly SLO, accessed Feb. 2019, 27 pages.
CUBESAT—California Polytechnic State University, "CubeSat Design Specification (CDS) REV 13," The CubeStat Program, Cal Poly SLO, accessed Feb. 2019, 42 pages.
Invitation to Pay Additional Fees and, Where Applicable, Protest Fee for International Patent Application No. PCT/US18/50286, Applicant: Orbit Fab, Inc., Nov. 6, 2018, 3 pages.
Invitation to Pay Additional Fees and, Where Applicable, Protest Fee for International Patent Application No. PCT/US18/50309, Applicant: Space Arena, Inc., Nov. 21, 2018, 2 pages.
National Aeronautics and Space Administration (NASA), "CubeSat 101—Basic Concept and Processes for First Time CubeSat Developers," NASA CubeSat Launch Initiative, revision Oct. 2017, 96 pages.
Researchgate.net, "Analysis of a hybrid genetic simulated annealing strategy applied in multi-objective optimization of orbital maneuvers," https://www.researchgate.net/figure/LEO-GTO-and-GEO-trajectories_fig10_315689898, Mar. 22, 2017, 1 page.
NASA Johnson, Out of This World Cup, YouTube (Jun. 25, 2014), URL: https://www.youtube.com/watch?v=UpBwvPel5VM.
Euronews (in English), Out-of-this-World Cup: Astronauts play zero-G football at ISS, YouTube (Jun. 12, 2014), URL: https://www.youtube.com/watch?v=YjZ6rydAT_Y.
Euronews (in English), From outer space: Astronauts in football fever, YouTube (Jun. 25, 2014), URL: https://www.youtube.com/watch?v=aSVpo-vXPIQ.
NASA Video, International Toys in Space: Soccer, YouTube (May 15, 2013), URL: https://www.youtube.com/watch?v=Ayhuejk88CE.
Insideiss, Inside the ISS—World Cup Wager, YouTube (Jun. 27, 2014), URL: https://www.youtube.com/watch?v=nEimciGwtmw.
NASA Video, Baseball in Micro-g, YouTube (May 22, 2013), URL: https://www.youtube.com/watch?v=BprHvigmZCo.
VincentVanGoing, Japanese Astronaut Plays Baseball in Space, YouTube (Nov. 25, 2011), URL: https://www.youtube.com/watch?v=xsNFqMtNZvl.
Gdavisloop, Outer Space Sports in HD!, YouTube (Aug. 14, 2010), URL: https://www.youtube.com/watch?v=vxutSgmDIUo.
NASA, Space Station Crew Talks Space and Sports, YouTube (Apr. 23, 2015), URL: https://www.youtube.com/watch?v=O89oUoaj0zo.
NASA Video, Football in Micro-g, YouTube (May 22, 2013), URL: https://www.youtube.com/watch?v=Vgmt_pY4yhk.
Astro Enzo, American Football on the International Space Station, YouTube (Feb. 13, 2016), URL: https://www.youtube.com/watch?v=Lo6hGEMMGcA.
On Demand news, How far can you throw a football in space?, YouTube (Feb. 4, 2017), URL: https://www.youtube.com/watch?v=OXuoTZ90ego.

(56) References Cited

OTHER PUBLICATIONS

World Science Festival, Fun, Games, and Newtonian Physics in Space, YouTube (Mar. 9, 2015), URL: https://www.youtube.com/watch?v=rBQNn0prRpw.
NASA, ISS Astronaut talks Space and Sports, YouTube (Oct. 23, 2014), URL: https://www.youtube.com/watch?v=sMaUUwci1YA.
Challenger Center, Can You Play Sports in Space?, YouTube (Jun. 10, 2008), URL: https://www.youtube.com/watch?v=A8rbvqX-WcU.
Challenger Center, Sports in Space, YouTube (Sep. 12, 2008), URL: https://www.youtube.com/watch?v=byyj3jkIHHY.
Challenger Center, Richard Garriott Space Video Blog: Sports in Space, YouTube (Mar. 11, 2009), URL: https://www.youtube.com/watch?v=4IyUVb-AoVQ.
VideoFromSpace, Astronauts' Tennis Match in Space Broadcast on Unisphere—Raw Video, YouTube (Aug. 22, 2018), URL: https://www.youtube.com/watch?v=8tWdytFse7Q.
European Space Agency, ESA—Luca Parmitano kicked off Italy—Australia rugby match, YouTube (Nov. 14, 2013), URL: https://www.youtube.com/watch?v=AC031gi0FyE.
NASA Video, International Toys in Space: Hockey, YouTube (May 15, 2013), URL: https://www.youtube.com/watch?v=sT_nNTA7EC0.
NASA Video, International Toys in Space: Lacrosse, YouTube (May 15, 2013), URL: https://www.youtube.com/watch?v=gF8Sgu5IUNQ.
NASA Johnson, Liquid Ping Pong in Space—RED 4K, YouTube (Jan. 21, 2016), URL: https://www.youtube.com/watch?v=TLbhrMCM4_0.
Adam Savage's Tested, Astronaut Chris Hadfield Plays Jamie Hyneman and Adam Savage's SpaceGame on the ISS, YouTube (May 20, 2013), URL: https://www.youtube.com/watch?v=cobJzLQqUmo.
NASA Video, International Toys in Space: Kendama, YouTube (May 15, 2013), URL: https://www.youtube.com/watch?v=VXoNMYDvPHM.
NASA Video, International Toys in Space: Jump Rope, YouTube (May 15, 2013), URL: https://www.youtube.com/watch?v=Kmvj6f3TPo.
Benjamin Strevy, Apogee of Fear, YouTube (Nov. 28, 2012), URL: https://www.youtube.com/watch?v=2fv3ZJ2J89M.
Plasma Ben, Dancing T-handle in zero-g, HD, YouTube (Mar. 2, 2009), URL: https://www.youtube.com/watch?v=1n-HMSCDYtM.
Challenger Center, Richard Garriott Space Video Blog: Conservation of Momentum, YouTube (Mar. 11, 2009), URL: https://www.youtube.com/watch?v=4IYDb6K5UF8.
European Space Agency, ESA, Gyroscopes in space, YouTube (Mar. 21, 2016), URL: https://www.youtube.com/watch?v=xQb-N486mA4.
Brown Family + More, Apollo 13 Test Shoot—Playing Catch in Zero Gravity, YouTube (Jul. 6, 2016), URL: https://www.youtube.com/watch?v=5IAAjk3QdU8.
Wix.com, Capture Your Dream Photo | Behind the Scenes | Wix.com, YouTube (Aug. 8, 2017), URL: https://www.youtube.com/watch?v=OtgScc_ryL0.
Wix,com, Capture Your Dream Photo winner Reiko Wakai | Photographing in Zero G | Wix.com, YouTube (Aug. 9, 2017), URL: https://www.youtube.com/watch?v=z05t4Goaugc.
Fstoppers, 360 Degree Video Camera in Zero G Plane, YouTube (Aug. 8, 2017), URL: https://www.youtube.com/watch?v=zVttmv9Rm_g.
Discovery, Classic NASA Film—Skylab—#4, YouTube (Jul. 9, 2008), URL: https://www.youtube.com/watch?v=S_p7LiyOUx0.
Cybrbeast, NASA astronauts performing gymnastics on board of the Skylab, YouTube (Nov. 5, 2012), URL: https://www.youtube.com/watch?v=d1sr6aVzW9M.
Nasa, The Skylab Legacy—Long Duration Space Flight, YouTube (May 14, 2013), URL: https://www.youtube.com/watch?v=JZNKVnDvQY4.
PGA Tour, Moon Shot: Alan Shepard plays golf in space, YouTube (Feb. 8, 2011), URL: https://www.youtube.com/watch?v=BUwGe9zzxoE.
Roy Dawson, Apollo 14 Alan Shepard Golf age 47 oldest American on the Moon video, YouTube (Dec. 7, 2013), URL: https://www.youtube.com/watch?v=NTnoyaffOkQ.
AP Archive, Astronaut hits golf ball into space, YouTube (Jul. 21, 2015), URL: https://www.youtube.com/watch?v=cSy3Cb9VXL8.
CollectSPACE, Space Station Golf Shot, YouTube (Nov. 22, 2006), URL: https://www.youtube.com/watch?v=0dlPf5tDuLo.
Public Domain TV, Amazing Experiments with a Yo-Yo in Zero Gravity, YouTube (Aug. 31, 2012), URL: https://web.archive.org/web/20160506031157/https://www.youtube.com/watch?v=1IqxCuKR9PY.
NASA Video, International Toys in Space: Boomerang, YouTube (May 11, 2013), URL: https://www.youtube.com/watch?v=6Vj-FoJky6w.
NASA Johnson, 4K Video of Colorful Liquid in Space, YouTube (Oct. 9, 2015), URL: https://www.youtube.com/watch?v=bKk_7NIKY3Y.
BuzzFeedVideo, What Happens Without Gravity?, YouTube (Oct. 31, 2013), URL: https://www.youtube.com/watch?v=nGfeJ3bRLcc.

\* cited by examiner

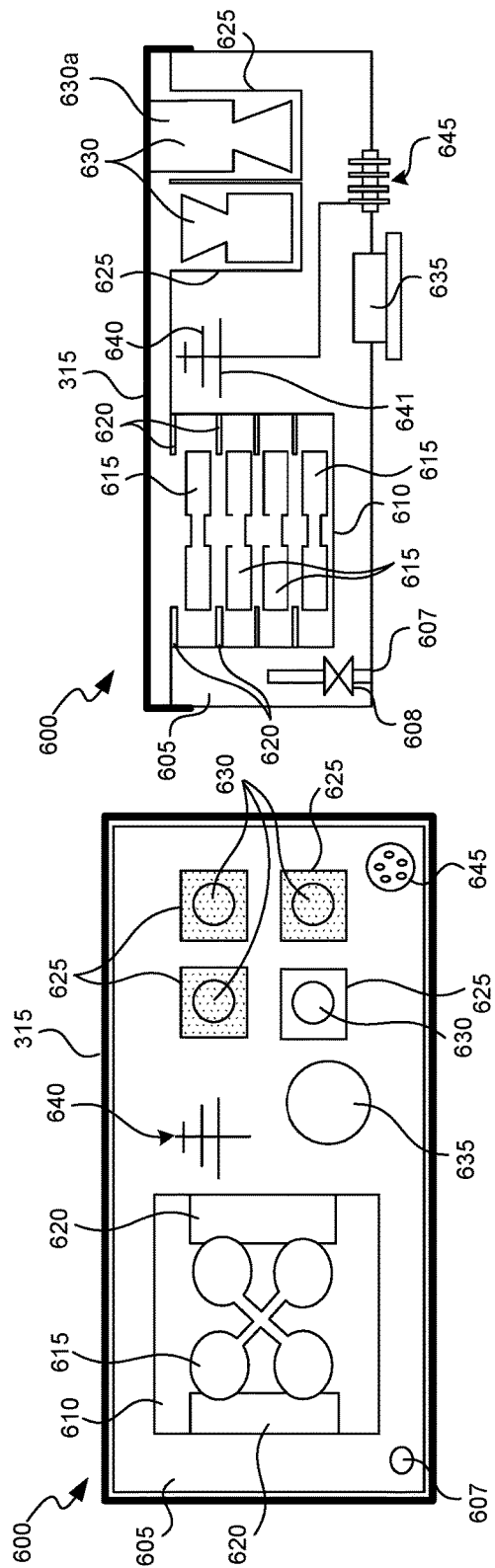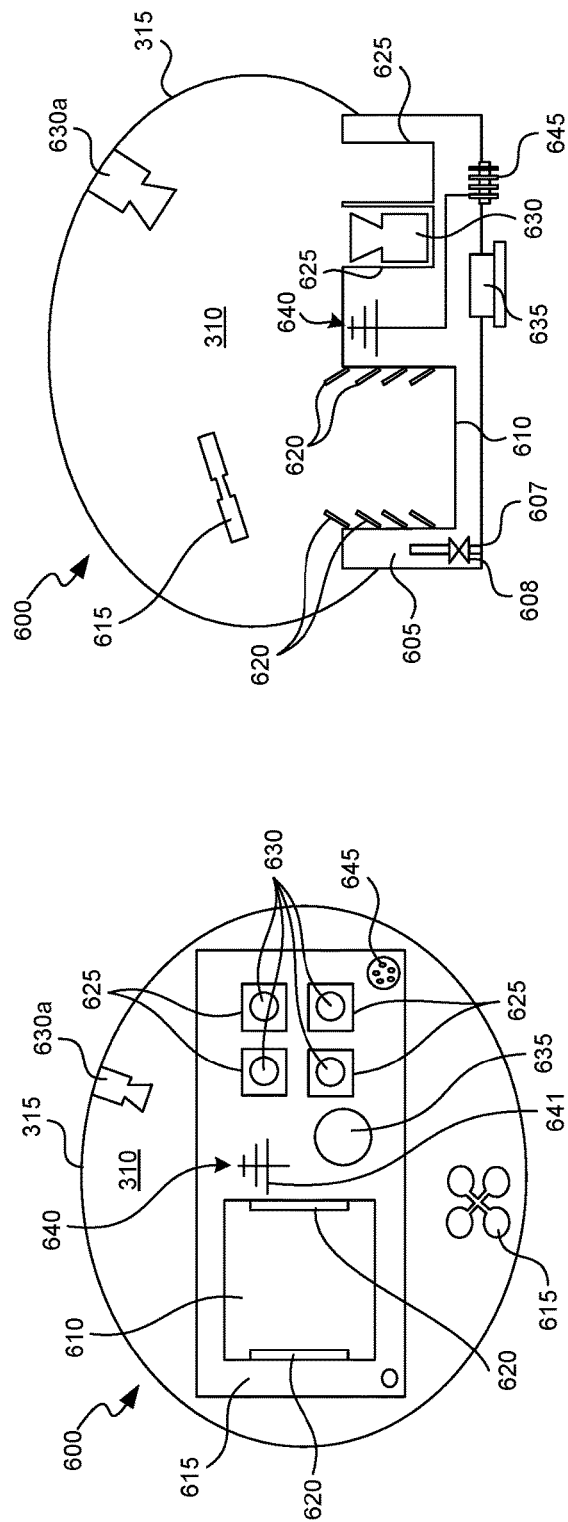

ENCLOSURES FOR FACILITATING ACTIVITIES IN SPACE, AND ASSOCIATED SYSTEMS AND METHODS

CROSS-REFERENCE TO RELATED APPLICATIONS

The present application is a continuation of U.S. patent application Ser. No. 16/127,111, filed Sep. 10, 2018, now U.S. Pat. No. 11,273,932, which claims priority to U.S. Provisional Patent Application No. 62/595,238, filed Dec. 6, 2017 and U.S. Provisional Patent Application No. 62/556,468, filed Sep. 10, 2017, each of which is incorporated herein in its entirety by reference.

TECHNICAL FIELD

The present technology is directed generally to enclosures for facilitating activities in space, and associated systems and methods.

BACKGROUND

Existing sports and entertainment venues, and the sports and entertainment activities carried out within those venues, have been unchanged for many years. For example, existing sports are played on Earth and involve a fixed playing surface with a fixed amount of gravity and aerodynamic resistance. Robotic battles, virtual reality, unmanned aerial vehicle (UAV) races, and other recent activities are becoming increasingly popular, but even engaging in competitions associated with the latest technology is limited to an Earth-based environment, with the drawbacks associated with fixed gravity and fixed aerodynamic constraints.

BRIEF DESCRIPTION OF THE DRAWINGS

FIGS. 6A-6D illustrate a deployment process for a flexible membrane and equipment associated with providing entertainment and/or other activities, according to embodiments of the present technology. FIG. 6A illustrates a top view of a deployable space system in a stowed configuration, FIG. 6B illustrates a side view of the system in a stowed configuration, FIG. 6C illustrates a top view of the system in a deployed configuration, and FIG. 6D illustrates a side view of the system in a deployed configuration.

DETAILED DESCRIPTION

Figure 1:
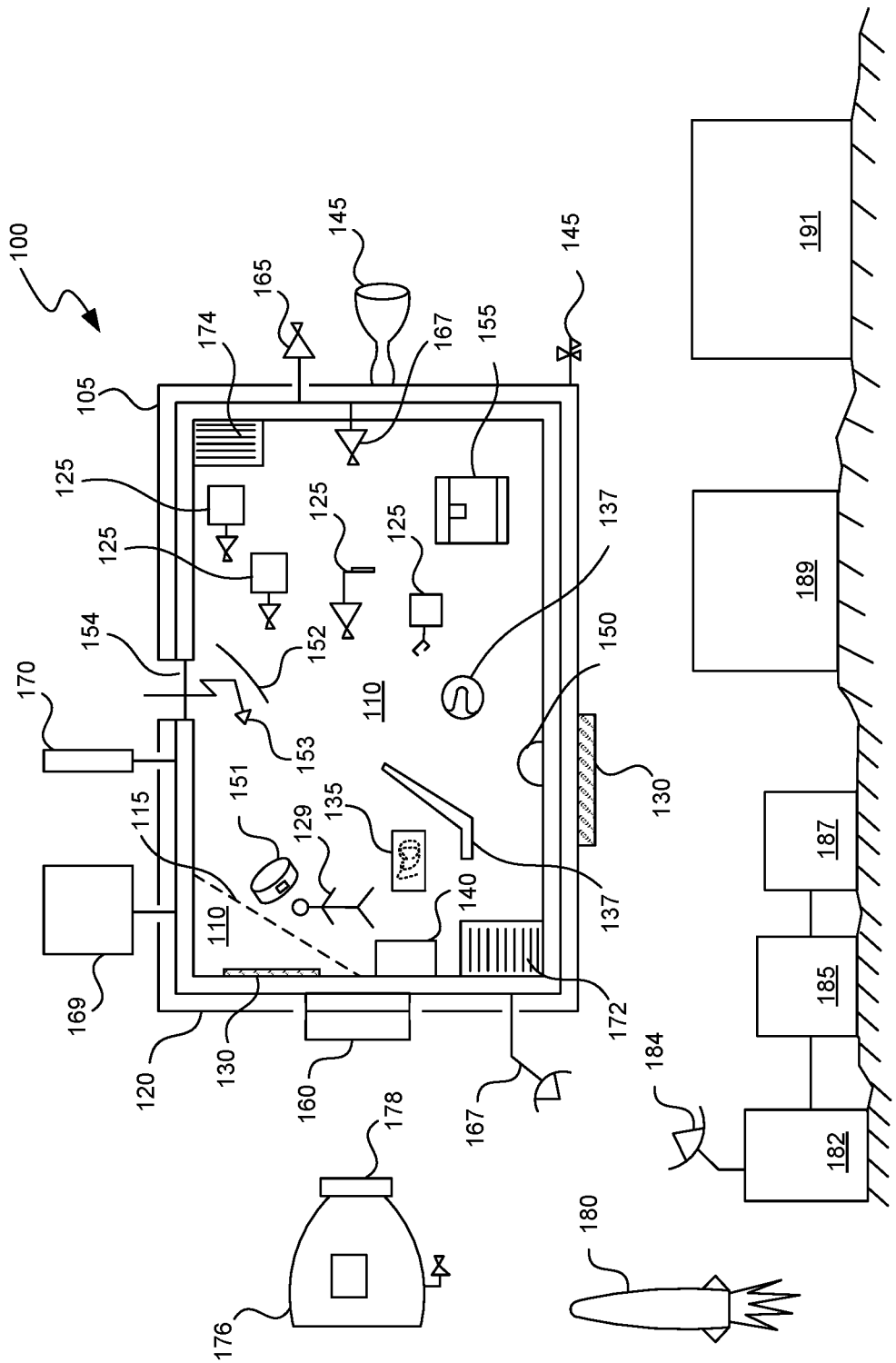
FIG. 1 illustrates a schematic view of a space system 100 in accordance with embodiments of the present technology.

Several embodiments of the present technology are directed to enclosures for facilitating activities in space, and associated systems and methods. Any of the features described herein can be combined in suitable manners with any of the other features described herein without deviating from the scope of the present technology.

Many specific details of some embodiments of the technology are set forth in the following description and FIGS. 1-6D to provide a thorough understanding of these embodiments. Well-known structures, systems, and methods that are often associated with such embodiments, but that may unnecessarily obscure some significant aspects of the technology, are not set forth in the following description for purposes of clarity. Moreover, although the following disclosure sets forth some embodiments of the technology, some embodiments of the technology can have different configurations and/or different components than those described in this section. As such, the technology can include embodiments with additional elements, and/or without several of the elements described below with reference to FIGS. 1-6D.

Many embodiments of the technology described below may take the form of computer- or controller-executable instructions, including routines executed by a programmable computer or controller. Those skilled in the relevant art will appreciate that the technology can be practiced on computer/controller systems other than those shown and described below. The technology can be embodied in a special-purpose computer, controller or data processor that is specifically programmed, configured or constructed to perform one or more of the computer-executable instructions described below. Accordingly, the terms "computer" and "controller" as generally used herein refer to any data processor and can include Internet appliances and hand-held devices (including palm-top computers, wearable computers, cellular or mobile phones, multiprocessor systems, processor-based or programmable consumer electronics, network computers, mini computers and the like). Information handled by these computers can be presented at any suitable display medium, including an LCD.

The technology can also be practiced in distributed environments, where tasks or modules are performed by remote processing devices that are linked through a communications network. In a distributed computing environment, program modules or subroutines may be located in local and remote memory storage devices. Aspects of the technology described below may be stored and/or distributed on computer-readable media, including magnetic or optically readable or removable computer disks, as well as distributed electronically over networks. Data structures and transmissions of data particular to aspects of the technology are also encompassed within the scope of the embodiments of the technology.

A. System Overview

The present technology provides environments, facilities, processes, and/or devices configured to facilitate activities in space, such as sports or entertainment. Some embodiments of the present technology can be referred to as arenas. For example, facilities can include enclosed volumes in space for performing activities such as sports, concerts, filmmaking, and/or other activities that are currently limited to Earth-based environments. Embodiments of the present technology can be implemented in an extraterrestrial environment, such as in space (e.g., Earth orbit or another orbit) or on other bodies such as moons or asteroids. Activities performed by facilities and devices disclosed herein can be autonomous, semi-autonomous, or non-autonomous, and can include assistance by robots, artificial intelligence, and/or humans.

Some of the systems, facilities, and/or devices according to the present technology include space systems that in turn include spacecraft with enclosed interior volumes (which may or may not be inflatable or otherwise expandable), robots (such as UAVs or drones, and/or non-flying robots) within the interior volumes, and deployment systems. The space systems and spacecraft of the present technology can be used to carry out space missions for entertainment and/or other activities.

B. Space Systems for Accommodating and Generating Entertainment

FIG. 1 illustrates a schematic view of a space system 100 configured in accordance with embodiments of the present technology. A spacecraft 105, which can be positioned in space, can be configured to facilitate sports, filmmaking, music, art, events, and/or other activities in a low or no-gravity environment or in a simulated gravity environment. Accordingly, the spacecraft 105 can be referred to as an arena.

The spacecraft 105 can include one or more enclosed interior volumes 110, which can be separated by one or more bulkheads 115, which can be flexible (such as a net, sheet, and/or flexible diaphragm) or rigid (such as a metal, plastic, and/or ceramic material), or semi-rigid. Bulkheads 115 can be transparent, translucent, or opaque. In some embodiments, the bulkheads 115 can be barriers (for example, liquid and/or gas barriers), or they can be selective filters (for example, allowing particles of certain size to pass through). In some embodiments, bulkheads 115 can change character (for example, between transparent or translucent and opaque by adjusting a liquid crystal display panel, or by mechanical changes). In some embodiments, the bulkheads 115 provide privacy, adjustable lighting, acoustics, aesthetics, and/or radiofrequency reflection and/or attenuation. The bulkheads 115 can function as backdrops and/or displays, and/or they can protect viewers onboard the spacecraft 105 from activities in one or more of the interior volumes 110.

One or more walls 120 of the spacecraft 105 can be rigid or flexible. In some embodiments, portions of the walls 120 can be rigid while other portions can be flexible. In some embodiments, one or more walls 120 of the spacecraft 105 or portions thereof can be translucent, transparent, and/or opaque. As described in additional detail below, one or more walls of the spacecraft can be inflatable and/or deployable (such as a deployable membrane). The spacecraft 105 need not be formed with only one module, and can be formed with multiple spacecraft or modules connected together.

Sports, concerts, or other activities can be conducted in one or more of the interior volumes 110. In some embodiments, the interior volumes 110 are pressurized with air (such as one atmosphere of human-breathable air). One or more robots, such as drones 125 (which can include UAVs such as multicopters or other aerodynamically-propelled vehicles), and/or non-flying robots, can fly and/or otherwise move around in the interior volumes 110 to race, fight, and/or otherwise compete in a contest. In some embodiments, a contest can involve a drone battle in which drones 125 can initiate reduced-functionality modes (such as disabled propulsion or a return-to-home trajectory) as a result of contact with each other or as a result of a "hit" signal. In some embodiments, a hit signal can be transmitted from one robot or drone to the other and can include a laser and/or other light source. In some embodiments, a "hit" signal can be generated by a robot when a robot detects another robot in a target area (such as "crosshairs), and/or when a user or controller activates a trigger or "fire" command. In some embodiments, robots and/or controllers can create signals with image processing (e.g., one or more cameras determine the presence of another robot in the target area). Hit signals can be generated in other suitable ways. In some embodiments, a "trigger" may always be on, such that anytime a robot detects another robot's presence (visually or otherwise) a "hit" signal can be generated. In some embodiments, a drone 125 can strike a ball.

The one or more drones 125 can be controlled from within the spacecraft 105 or remotely (such as from another spacecraft or from Earth). In some embodiments, sports can include competitive sports involving one or more humans 129.

The drones 125 can include cameras which can observe the activities in the spacecraft 105. The drones 125 can include sensors for determining position, velocity, acceleration, and/or for detecting obstacles and/or targets within the interior volumes 110 (for example, LIDAR, sonar, radar, virtual-reality headset light towers, and/or cameras). In some embodiments, drones 125 can be used to reset gameplay in a particular sport, such as by resetting the ball and/or other equipment with robotic arms and/or end-effectors. The drones 125 can have other functions, such as repair and/or assembly of equipment within the spacecraft 105. In some embodiments, the drones 125 can have replaceable tooling (such as end-effectors) depending on the activity undertaken by the drones. The drones 125 can collaborate and communicate with other drones. In some embodiments, the drones 125 can operate outside of the interior volume 110 (such as in the vacuum of space).

The spacecraft 105 can include other features that facilitate entertainment. For example, a display 130 can be positioned on an interior surface of the spacecraft 105. In some embodiments, one or more displays 130 can partially or completely cover all of the internal surfaces of the spacecraft 105 surrounding one or more of the interior volumes 110. The displays 130 can show advertisements, background images, and/or they can provide specialized lighting. In some embodiments, a display 130 can include a scoreboard. Because numbers can be difficult to read in low gravity when a viewer's orientation can be random or otherwise unaligned with the display 130, quantities, shapes, colors, and/or arrangements of lights can be incorporated in the display 130 to convey scores and/or statistics to a viewer. Displays 130 can be positioned on exterior surfaces of the spacecraft 105 to convey information to other spacecraft or to convey information to cameras, telescopes, or binoculars on Earth. In some embodiments, one or more stages (e.g., a concert stage and/or a stage for plays or other entertainment) may be positioned in the spacecraft 105, in an interior volume 110.

In some embodiments, one or more playing surfaces 135 can be positioned to partially or completely cover one or more of the internal surfaces of the spacecraft 105. Playing surfaces can include wooden floors, artificial turf (e.g., a surface made to appear similar to a turf surface), and/or courts with line markings to resemble boundaries for sports (such as soccer, American football, hockey, boxing, and/or other sports). Playing surfaces can include "green screens" (e.g., surfaces with coloring and/or patterning that may or may not include green, suitable for a computer to overlay images) for computer systems to add images, textures, scores, and/or statistics in post-processing of video produced in the spacecraft 105. Playing surfaces or other surfaces can include texture for personnel to sense their position in the interior volume 110, for example if it is dark inside.

Sports equipment 137, such as a stick, ball, puck, and/or other equipment, can be included for use in the interior volumes 110. In some embodiments, sports equipment can include propulsion devices (for example, fans) to aid a player's movement around in the interior volumes 110. In some embodiments, equipment can include fins, paddles, webbed gloves, grab-points on clothing and/or other features for players to manipulate their way around the interior volumes 110. Personnel or other players can throw equipment as part of a contest.

In some embodiments, the spacecraft 105 can include an indicator 140, which can include a display, light, and/or color at least partially covering an interior wall within one or more of the interior volumes 110. The indicator 140 can be a reference to represent an orientation (for example, top, bottom, front, back, left, and/or right). In some embodiments, the indicator 140 can represent an orientation aligned with a simulated gravitational force provided by rotating the spacecraft using one or more thrusters 145. In some embodiments, a controller can change the color or display to change the representation of the orientation relative to the spacecraft. For example, a color or other indicator can initially suggest to a viewer that a simulated downward gravitational force is in a particular direction (e.g., towards a top, bottom, or side of the spacecraft), but the indicator can change to confuse or otherwise modify the viewer's perception of orientation. A controller in the spacecraft 105, outside of the spacecraft 105, or at a terrestrial location can change the indicator 140. In some embodiments, an indicator can include a QR code that may be readable by a camera or other reader to signal a representation of the orientation.

The spacecraft 105 can include one or more attachment points 150 to facilitate attachment and detachment of various equipment or as a grab-point for personnel or drones. In some embodiments, attachment points 150 can provide power to recharge the drones 125, and/or they can provide data connections.

Humans 129 can include crew, players, spectators, referees, medics, and/or other staff such as camera crews, production crews, and commentators. In some embodiments, humans 129 can be in separate interior volumes 110 and/or they can be positioned in a viewing area such as a grandstand or a seating area within one or more of the interior volumes 110. In some embodiments, spectator areas such as grandstands or seating areas can be designated by lasers or other lighting, one or more nets, ropes, line markings, surface markings or colorings, jets of air, and/or robots (such as drones) patrolling the boundaries of spectator areas. In some embodiments, sensors described herein and/or other sensors can be used to detect a violation of a boundary for separating spectators from activities and/or equipment. In some embodiments, humans 129 can wear one or more wearable devices 151, which can include sensors, notification systems, and/or monitoring devices to track the health, location, activity, and/or other metrics of crewmembers, players, and/or other personnel. In some embodiments, humans 129 can be replaced with robots controlled remotely to carry out entertainment tasks. Humans 129 can carry handheld remote controls and/or sensors to operate drones 129 and/or other aspects of the system 100.

The spacecraft 105 can include specialized lighting systems 152, which can be positioned inside the interior volume 110 and/or outside of the spacecraft 105. Lighting systems 152 can include reflective surfaces (such as mirrors or diffusers) and/or lighting panels or lights (including light-emitting diodes, electroluminescent wires, lasers, or other suitable light sources) to create lighting conditions appropriate for filming (e.g., movies or television broadcasts), photography, sports activities, concerts, and/or other human activities. In some embodiments, the lighting systems 152 can provide lighting for other activities such as cooking, training, operating equipment, and/or for emergency operations. In some embodiments, the lighting systems 152 can include filters, focusing systems, or defocusing systems. In some embodiments, the lighting systems 152 can be movable, and they can be controllable by hand, computer, and/or remote control. In some embodiments, natural light 153 can be provided to the interior volume 110 with one or more natural light transmitters 154, such as windows, light pipes, and/or fiber-optic cables facing outside of the spacecraft 105.

In some embodiments, a window can be located relative to a zenith or nadir of the spacecraft 105 to maximize light from the Sun or from Earth or moon reflections, or other sources, or to provide an optimal view (for example, an optimal view of Earth or outer space).

A manufacturing center 155 can be included inside the spacecraft 105. The center can include tools or equipment such as a 3D printer, lathe, mill, router, laser cutter, drill press, arbor press, hand tools, and/or other tools. The manufacturing center 155 can be movable around the interior volume 110.

In some embodiments, the spacecraft 105 can include other features and systems. The spacecraft 105 can include an airlock and/or docking port 160 (which can optionally include a window) which can provide ingress and egress into the interior volume 110. One or more externally-positioned sensors 165 can include cameras, LIDAR, radar, temperature sensing, pressure sensing, star or sun sensors, Earth sensors, magnetometers, radiolocation, global positioning system (GPS) sensors, vibration sensors, and/or other sensors suitable for providing relevant data for space operations. One or more internally-positioned sensors (within the volume 110) can include similar sensors as the externally-positioned sensors 165, and can further include humidity, sonar, air composition, smell detection sensors, and/or other sensors suitable for providing relevant data to monitor the safety of the interior volume 110. The spacecraft 105 can include one or more communications systems 167, which can include antennae and communication equipment for communicating with the ground and/or with other spacecraft. Power generation, storage, and/or distribution systems 169 for providing power to the spacecraft 105 can include solar arrays, batteries for energy storage, regulation, and associated wiring and controls. A thermal regulation system 170 can regulate the temperature of the interior volume 110 and other aspects of the spacecraft 105 with heaters, heat exchangers, radiators, coolers, and/or other thermal regulation equipment. Radiation shielding and meteoroid shielding can be included in the walls of the spacecraft 105.

The one or more thrusters 145 and/or other suitable actuators can provide direction control (e.g., pointing), thrust for orbit changes, and/or thrust to spin the spacecraft 105. Thrusters can include chemical thrusters, electrical thrusters, cold or warm-gas thrusters, and/or other devices suitable for providing thrust forces in space. In some embodiments, movements of the spacecraft 105 can be triggered by reaction wheels or other mechanical devices. In some embodiments, the spacecraft 105 can be selectively pointed or otherwise oriented to provide optimal lighting for videography, photography, views of Earth through windows or cameras, or for other purposes. In some embodiments, the spacecraft 105 can spin around one or more of its axes to provide artificial gravity using centripetal force. Artificial gravity or other sensations from spinning can enable or facilitate sports play (e.g., make it more exciting than ground-based versions). For example, a ball can be made to fall toward one wall or another. Artificial gravity can also improve videography and photography by providing a sensation of up and down.

In some embodiments, equipment 137, drones 125, and/or other systems and/or people can operate along an axis of rotation when the spacecraft 105 is spinning, where there is reduced or effectively zero sensation of gravitational (centripetal) force, while other objects or humans in the spacecraft 105 can be positioned along walls of the spacecraft to observe the equipment 137 or drones 125. In some embodiments, equipment, drones, and/or humans can be connected to the attachment points 150 to maintain a position either in the zero-gravity area (near the rotational axis) or in the positive-gravity area (away from the rotational axis). One or more attachment points 150 can optionally be positioned along the spin axis. As mentioned above, an indicator 140 can include wall coloring and/or lighting schemes to indicate a spin direction and/or orientation direction.

A computer system or controller 172 can receive data from systems within the spacecraft 105 and/or external sources, such as command data and/or sensor data, process that data, and control aspects of the spacecraft 105 accordingly. For example, the controller 172 can perform navigation operations, control spinning (with force from thrusters and/or other actuators), facilitate remote control of the spacecraft 105 and/or objects within the spacecraft 105 (such as drones), and/or other operations.

A chemical plant 174 can provide storage, processing, dispensing, and/or other control of chemicals required for life support on the spacecraft 105. For example, air filters, oxygen-replenishing systems, carbon dioxide and carbon monoxide scrubbers, and/or water purifiers can be onboard the spacecraft 105.

The space system 100 can further include a capsule 176 for transporting humans and/or supplies between a surface (such as Earth and/or the Moon) and orbit, and to dock with the spacecraft 105 or another spacecraft. The capsule 176 can have an airlock and/or docking port 178 to facilitate docking, ingress, and/or egress, and/or the port 178 can mate with the docking port 160 on the spacecraft 105. The space system 100 can further include one or more rockets 180 and/or other launch vehicles (not drawn to scale) for transporting the capsule 176 and/or the spacecraft 105 to space.

The space system 100 can include ground-based (i.e., terrestrial) elements. In some embodiments, the system 100 can include a ground station 182, with a communication link 184 to communicate with the communication systems 167 of the spacecraft 105. In some embodiments, communications relay spacecraft may relay communications between the ground station 182 and the spacecraft 105. The ground station 182 can receive and transmit audio, video, and control information to and from the spacecraft 105. The system 100 can further include an audio-video production area 185 and a distribution system 187 for creating and distributing (e.g., broadcasting) audio-video and/or data to end-users and viewers of the events and/or activities occurring in the spacecraft 105. For example, the production area 185 can be used to edit or manipulate information from the spacecraft 105 before the information is distributed as entertainment content. The distribution system 187 can include cable, satellite, internet, or other suitable distribution systems. For example, users can pay to access the content generated in the spacecraft 105 and the production area 185. Content may include three-dimensional content captured with three-dimensional cameras and distributed to three-dimensional viewers, such as three-dimensional displays in goggles.

The system 100 can further include a viewing arena 189 on the ground to facilitate group viewing or participation in events. A simulation environment 191 can include full or scale models of equipment, drones, and/or other objects in the spacecraft 105 to facilitate training or simulation. The simulation environment 191 can include a drone battle arena. In some embodiments, a terrestrial facility such as the viewing arena 189 can include displays (e.g., televisions or three-dimensional headsets) and/or remote-control systems coupleable to devices and/or objects (such as drones, robots, or cameras) in the spacecraft 105 to facilitate control of the devices and/or objects in the spacecraft 105 from Earth. Displays and remote-control systems can communicate with the spacecraft 105 and the devices (e.g., drones, robots, and/or cameras) via communication systems. In some embodiments, users can view and remotely control activities in the spacecraft 105 from any suitable location, such as their home. For example, users may manipulate drones, robots, and/or cameras.

Figure 2:
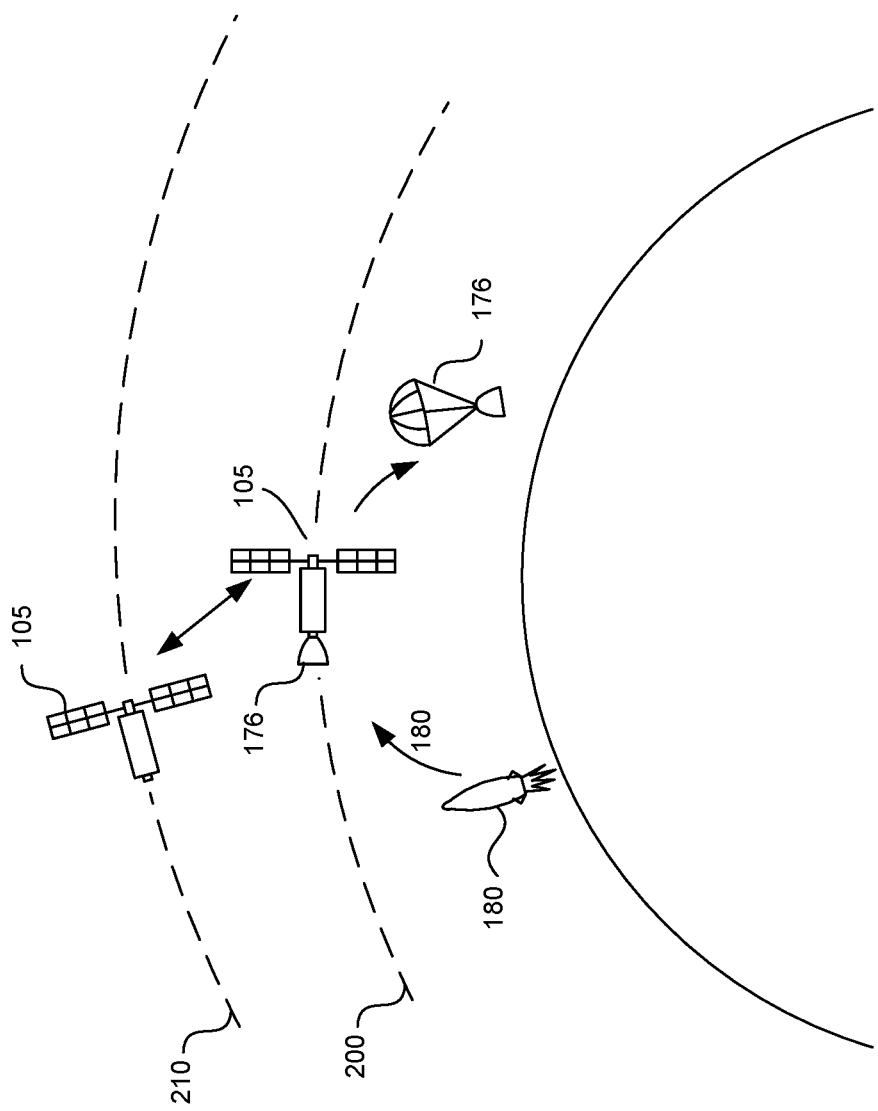
FIG. 2 illustrates a representative operational sequence of a space system in accordance with embodiments of the present technology.

In operation, one or more rockets 180 can launch to carry the spacecraft 105 and the capsule 176 to space (in the same launch or in multiple launches). FIG. 2 illustrates a representative operational sequence of the system 100 in accordance with embodiments of the present technology. With reference to FIG. 2, the spacecraft 105 and the capsule 176 can be positioned in a first orbit 200 (which can be a low operational orbit), where they can be docked together. The capsule 176 can carry personnel to access the spacecraft 105 to observe and/or participate in activities on the spacecraft 105. In the first orbit 200, the spacecraft 105 can facilitate activities such as sports or filmmaking. Upon completion, the capsule 176 can detach from the spacecraft 105 and descend to the ground (returning the personnel to the ground). In some embodiments, the spacecraft 105 can remain in the first orbit 200, or it can raise to a second orbit 210 (which can be a high parking orbit). In the second orbit 210, the spacecraft 105 can be stored in a low activity mode until it is needed for another event. The low activity mode can include turning off or reducing power to unnecessary systems, and/or stowing a deployable membrane (described later).

The spacecraft 105 can be lowered to the first orbit 200 for other events. Upon being lowered to the first orbit 200, the spacecraft 105 can enable an operational mode and carry out the entertainment event (e.g., broadcasting a sports contest and/or other activity). In some embodiments, another capsule 176 with personal and/or supplies can be launched with another rocket 180 to dock with the spacecraft 105 in the first orbit 200.

An advantage of storing the spacecraft 105 in the second (higher) orbit 210 is a reduced need for station-keeping due to reduced drag in the higher orbit. An advantage of lowering the spacecraft 105 to meet the capsule 176 in the first (lower) orbit 200 includes lower fuel and cost requirements to launch the capsule 176 to reach the lower orbit. Accordingly, raising the spacecraft 105 when it is not in use and lowering it to meet the capsule 176 is economical. The altitudes of the first and second orbits 200, 210 can be selected based on fuel requirements for the operational phase in the first (lower) orbit 200, fuel requirements for the parking phase in the second (higher) orbit 210, costs to launch and transfer to each orbit, and an expected frequency of use of the spacecraft 105. In some embodiments, when the spacecraft 105 is on orbit, it can be positioned in a low-drag configuration in which its long axis is aligned with the velocity vector and its smaller cross-sectional area is facing the velocity vector to minimize drag. External appendages, such as solar arrays, can be stowed to further reduce drag. In some embodiments, the spacecraft 105 need not return to the same second orbit for storage (it may be stored in any suitable orbit). In general, the spacecraft 105 can be stored and rendezvous with the capsule 176 or other spacecraft in any suitable orbit.

Figure 3:
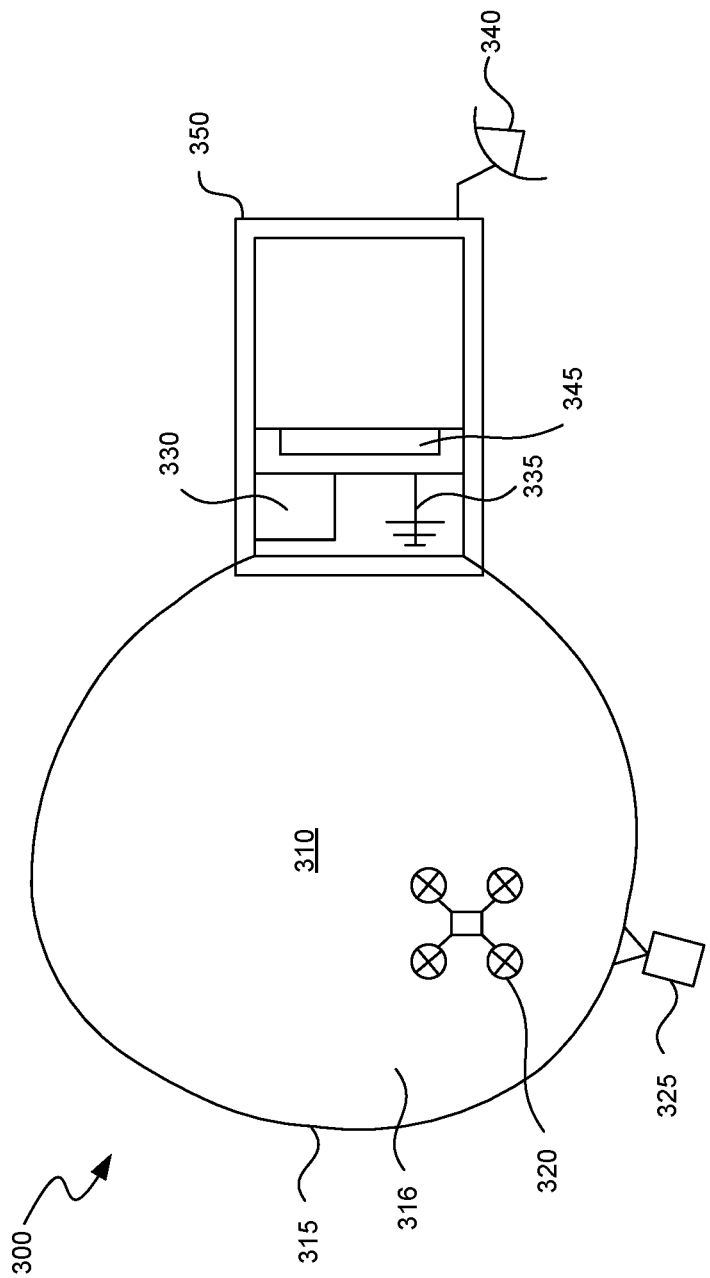
FIG. 3 illustrates a schematic view of a spacecraft with an enclosed interior volume in accordance with embodiments of the present technology.

FIG. 3 illustrates a schematic view of a spacecraft 300 with an enclosed interior volume 310 in accordance with embodiments of the present technology. The spacecraft 300 can be similar to the spacecraft 105 illustrated in FIGS. 1 and 2 and described above. For example, the spacecraft 300 can include any of the above systems and subsystems and can be operated in a generally similar manner. The spacecraft 300 can also include an expandable and/or inflatable membrane 315 to form the enclosed interior volume 310. In some embodiments, the membrane 315 can be formed with a polyimide material (such as a fluorinated polyimide), a latex or rubber material coated with protective materials (such as UV-protective materials and/or oxygen-resistant materials) and/or an elastic or inelastic flexible material suitable for stowing (such as by folding, rolling, and/or other compression into a small profile), deployment, and/or holding pressure in the vacuum of space. In some embodiments, the membrane 315 can be formed with impact-resistant materials, tear-resistant materials, and/or self-healing materials.

In some embodiments, the membrane 315 can be formed with radio frequency (RF) reflective material to create a Faraday cage around the interior volume 310. As described in additional detail later, such a Faraday cage can be configured to reflect (e.g., in an optimized manner) the energy used to transmit wireless electrical charging signals at one or more frequencies. In some embodiments, the material can permit transmission of some frequencies without reflection, for example, to facilitate communication between the interior volume 310 and other locations. In some embodiments, conductive lines and/or traces can be positioned in the membrane 315 to carry electrical power, and/or an entire surface (interior or exterior) of the membrane 315 can be conductive.

The membrane 315 can include multiple layers. For example, some or all of the membrane 315 can include: a mechanical restraint layer (straps, nets, webbing, ropes, and/or a woven material) to restrain objects within the interior volume 310, a fluid restraint layer, an RF restraint layer (which can reflect or filter one or more RF frequencies), a structural layer (which can resist abrasion and/or cyclic stressing of the layers, and/or can include supports for equipment such as cameras or other equipment mounted on the membrane 315), a micro-meteoroid protection layer, a sensor layer (with one or more embedded sensors), and/or a visual layer (a layer of colored, painted, textured, and/or lighted surface). Layers can overlap, but in some embodiments, some parts of the membrane can have a first selection of layers and another part can have another selection of layers. For example, a textured surface can be positioned inside half of the membrane 315 to simulate the ground, while the remainder of the membrane 315 can be transparent. Portions of the membrane that are transparent or translucent can include tinting to shield from solar light and radiation. In some embodiments, a majority of the membrane 315 can be transparent or translucent.

In some embodiments, the membrane 315 can include an interior or exterior surface finish that can be smooth, reflective, or non-reflective. In some embodiments, the membrane 315 can have one or more portions that are opaque, translucent, or transparent, or the membrane 315 can be fully opaque, translucent, or transparent. For example, a portion of the membrane 315 (such as a hemisphere closest to the Sun) can be opaque to function as a sun shade or sun block. In some embodiments, logos, advertisements, and/or artwork can be included in the layers. The layers can carry sensors for pressure, temperature, stress, radiation, gas/liquid composition, and/or other measurable characteristics.

The spacecraft 300 can include any of the systems, subsystems, and/or other elements included in the spacecraft 100 described above. Although the membrane 315 can be generally spherical, as shown in FIG. 3, in some embodiments, the membrane 315 can have other shapes, including cubes, various polyhedrons, toroids, cylindrical, or irregular shapes.

The membrane 315 can operate fully or partially inflated, and it can be filled with one or more suitable gases 316, including an inert gas, a heavy gas, a UV-stable gas, and/or another gas or liquid or combination of gases or liquids suitable for providing an environment for the intended event. In some embodiments, the interior volume 310 can include gas resembling Earth's atmospheric composition (approximately 80% nitrogen and approximately 20% oxygen). In some embodiments, the gas can include a high molecular mass (such as a sulfur hexafluoride), which can provide higher reaction force for drones with propellers or other propulsion systems. A pressurization system can be connected to the membrane 315 to provide gas to the interior volume 310. The pressurization system can include a pressure tank, a gas generator, an electrolysis or pyrolysis system, and/or another suitable gas source. One or more fans can be positioned in the membrane 310 to circulate the air or to cause airflow to contribute to gameplay (by agitating the air to cause turbulence, for example).

A robot or drone 320 (which can include a non-flying robot, or a flying robot such as a UAV in the form of a multicopter or a fixed-wing aircraft) can be positioned in the interior volume 310 to perform maneuvers, such as aerodynamic maneuvers or other maneuvers. The drone 320 and the drones 125 described above with regard to FIG. 1 can be similar to each other and can act similarly to each other, with similar functions and features. The drone 320 can be propelled by propellers, compressed air, suction, a Lorenz force system, and/or other suitable devices or systems. For example, the spacecraft 300 can include a magnetic field generator, such as a Helmholtz coil, which can create a magnetic field that interacts with coils on a drone 320 to create torque and thrust to move the drone 320. In some embodiments, the drone 320 can be propelled by electrostatic force created by a system that invokes an electrical charge in the drone 320 relative to its surroundings. In some embodiments, robots or drones 320 can have wheels or legs to walk or crawl on walls, for example when the spacecraft 300 is spinning to create artificial gravity. The drones 320 can have one or more pre-programmed sequences, such as spiral or flip maneuvers, attack or defend maneuvers or positions, or return-to-base maneuvers.

Drones 320 can be made robust to survive in a vacuum and/or to survive radiation or extreme thermal conditions, for example. In some embodiments, because multicopters can operate in low gravity, they can be configured to provide negative thrust to thrust in several directions (including "up" and "down").

In some embodiments, drones 320 can be small relative to the overall volume 310 (such as less than 10% of a minimum diameter of a round volume 310) to provide sufficient room for entertaining movements. Drones 320 can carry cameras to record and communicate audiovisual and/or other data about the activity in the spacecraft 300.

In some embodiments, the drones 320 can have aesthetic features to aid in identification, simulate objects from popular culture (such as science fiction or video games), advertising, or other aspects that provide entertainment. Post-production of video transmitted from the spacecraft 300 can involve overlaying graphics such as logos, text, status, advertisements, or special effects like flames, sparks, appendages, or hair. The drones 320 can have markings or features such as QR codes or other indicators to aid post-production computers with positioning the graphics. Markings or features can also provide locators for augmented reality to add virtual features to improve viewer experiences.

The drones 320 can be powered by wireless power systems (such as inductive power systems and other power systems described in additional detail below), or they can be powered by solar power with onboard photovoltaic systems, and/or by onboard batteries that the spacecraft 300 can charge with a suitable charging system. In some embodiments, the drones 320 can have conductive points that contact a conductive inner surface of the membrane 315 to transmit power.

The drones 320 can include one or more static discharge systems, bump protection systems (such as bumper bars, zones with padding, or shielding around sensitive parts such as propellers), stabilization systems (reaction wheels, magnetorquers to react against Earth's magnetic field or another magnetic field produced by or near the spacecraft 300, thrusters, aerodynamic features, and control systems, for example), and/or telemetry systems (measurement of power characteristics, temperature, orientation, location, and other relevant measurements, which the spacecraft 300 and/or the drone 320 can store and/or transmit to another location such as a control center). In some embodiments, the drones 320 can include lights (to illuminate a camera view or to provide identification to viewers or other drones), and/or a scoreboard or display (for example, to show a score or a health state, a countdown timer relevant to the game, an advertisement or other content, or a green screen to add content in post-production). In some embodiments, the drones 320 can include end-effectors such as grippers. In some embodiments, the drones 320 can include lasers and laser detectors (to indicate a laser "hit") for "laser tag" and/or target designation. The drones 320 can function as obstacles and/or they can be direct participants in games or activities.

The spacecraft 300 can include one or more cameras 325 mounted inside, outside, and/or on the membrane 315 to observe activity in or around the interior volume 310. In some embodiments, cameras 325 can be mounted directly to the membrane 315 or on a boom or other support within or outside of the membrane 315. Cameras 325 can generally be in any suitable position to record or transmit audio and/or video to a receiving location (such as one of the ground stations described with regard to FIG. 1, or to a viewer's home, for example). In some embodiments, cameras 325 can include stereo vision for three-dimensional viewing by a user in another location with a suitable three-dimensional display. Cameras can include shielding to avoid solar glare or radiation.

In some embodiments, the cameras 325 can include lights, or lights can be positioned where cameras are located, or in different locations than the cameras 325. Lights can have programmable intensity controlled by a controller and they can output one or more different wavelengths such as infrared, visible light, or colored lights. Lighting changes can be reactive to vibrations in the membrane 315.

In some embodiments, the spacecraft 300 can include a power system, which can provide power to the drones 320 by wireless power (described below) or by contact terminals to which the drones 320 can connect.

In some embodiments, the spacecraft 300 can include a communications system 335, which can provide wireless communication between the drones 320 and the spacecraft 300 (for example, transmission of audio, video, and/or other data including control and/or sensor data). The communications system 335 can also provide wireless communication with cameras 325 and/or other systems in the spacecraft 300. Communications systems disclosed herein can be configured to avoid interference with the wireless power system. The communication system 335 can include an antenna 340 to communicate suitable data between the spacecraft 300 and other spacecraft and/or to a ground station on Earth.

The spacecraft 300 can include a computer system and/or controller 345 configured to operate the systems and subsystems of the spacecraft 300 (such as telemetry systems, propulsion control systems, navigation systems, communication systems, thermal systems, the drones 320, and/or other systems). The computer system and/or controller can include software and/or hardware to improve images from the cameras.

The spacecraft 300 can include a body 350, which can carry various components of the spacecraft 300 before and after the membrane 315 and/or the drones 320 are deployed. In some embodiments, the body 350 can also carry propulsion systems, solar arrays, guidance systems, navigation systems, and/or control systems. For example, the body 350 can include thrusters for orbital maneuvering and/or to induce rotation of the spacecraft 300 (similar to the thrusters described above with regard to the spacecraft 100 illustrated in FIG. 1). Thrusters can be used to invoke interesting gameplay scenarios, by changing orientation of the spacecraft 300.

In some embodiments, the body 350 can be configured to have a size and shape similar to a CubeSat. The body 350 can include multiple other bodies joined with the body 350. In some embodiments, the body 350 can be attached to an upper stage portion of a launch vehicle (for example, a launch vehicle can carry the body 350 to space with or without the body 350 being deployed separately from the launch vehicle). Appendages that can optionally extend from the body 350 (such as solar arrays) can provide shading or aesthetic interest (such as simulated planetary rings) when visible through a transparent or translucent membrane, or when otherwise visible.

The spacecraft 300 can communicate with a ground station (such as the ground station 182 described above with reference to FIG. 1) to transmit audio, video, and/or control data. Likewise, the spacecraft 300 can communicate with a production area 185 (see FIG. 1 and description above), which can generate visuals, add overlays, add commercial breaks to events, and/or distribute data streams to consumers, for example.

Figure 4:
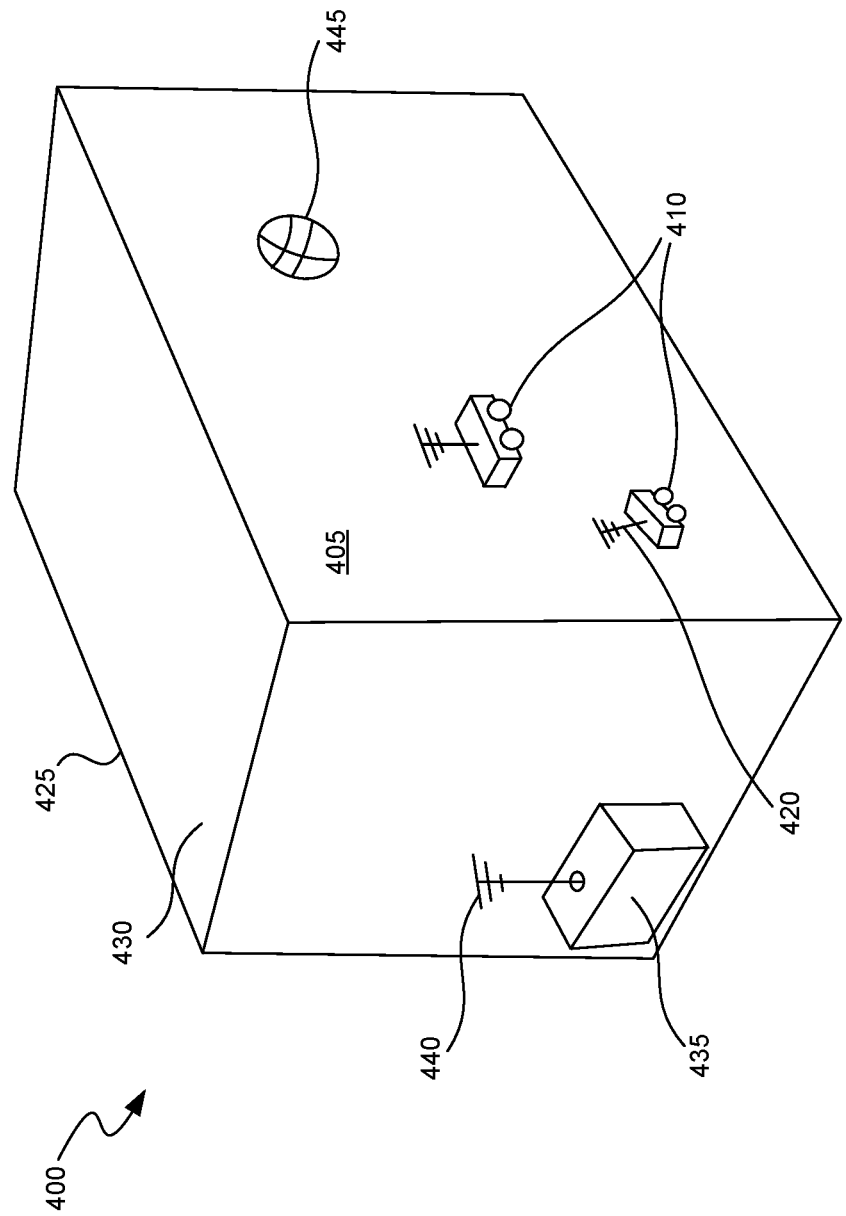
FIG. 4 illustrates a wireless power system for spacecraft in accordance with embodiments of the present technology.

FIG. 4 illustrates a wireless power system 400 configured to power devices within a spacecraft in accordance with embodiments of the technology. In some embodiments, the wireless power system 400 floods an enclosed interior volume 405 with radiofrequency energy. Receiving systems 410, which can include drones, sensors, lighting systems, fans, communication systems, and/or other systems that require power, can receive the radiofrequency energy (for example, by one or more antennas 420, which can be omnidirectional or directional) and convert it to electrical power according to known inductive charging and/or rectification principles. Other receiving systems 410 can include components of games to be played or activities to be performed in the volume 405.

In some embodiments, the wireless power system 400 can direct or beam the radiofrequency energy to selected targets or portions of an enclosed volume 405, and/or the enclosed volume 405 can include shielding and/or bulkheads to prevent the energy from reaching certain portions of the enclosed volume 405.

The enclosed volume 405 can be formed with an inflatable membrane 425 (such as one of the membranes described above) or by rigid or semi-rigid walls (such as walls 120 of the spacecraft 105 described above). An interior surface of the membrane or walls surrounding the volume 405 can be formed as a Faraday cage 430 to reflect the radiofrequency energy to improve (e.g., maximize) the efficiency of the system 400. For example, the interior surface can reflect sufficient radiofrequency energy to avoid dead spots or null areas where the signal would be unavailable. The Faraday cage can be formed by a conductive interior surface, by conductive lines and/or traces inside on and/or in the membrane 425 or walls 120, and/or by other structures such as a mesh material on the outside of the membrane 425.

In some embodiments, neither a length, nor a width, nor a radius of the Faraday cage 430 is a multiple of a wavelength of the radio-frequency signals. In particular embodiments, neither a length, nor a width, nor a radius of the Faraday cage 430 is a unit-multiple (e.g., an integer or whole-number multiple) of a quarter-wavelength (e.g., ¼ of the wavelength) of the radio-frequency signals. In other embodiments, neither a length, nor a width, nor a radius of the Faraday cage 430 is a unit-multiple of an eighth-wavelength (e.g., ⅛ of the wavelength) of the radio-frequency signals. A representative Faraday cage in accordance with embodiments of the present technology does not have such a dimension. By avoiding such multiples, RF standing waves are minimized, which reduces the risk or occurrence of nulls or other regions of poor signal (e.g., power) reception within the enclosed volume 405.

In some embodiments, the Faraday cage 430 can allow transmission of selected frequencies to facilitate communication between objects in the volume 405 and outside of the volume 405. A smart system can control the wireless power system 400 to adjust the amplitude and frequency of the signals for optimal signal quality within the volume 405.

The wireless power system 400 includes a transmission system 435 connected to one or more transmission antennas 440 (which can be omnidirectional and/or redundant) for creating and/or distributing the radiofrequency energy into the volume 405. In some embodiments, multiple antennas 440 can transmit multiple wireless charging bands of radiofrequency energy. In some embodiments, one or more of the antennas 440 can provide directed energy, by phased array, phase-adjusted amplifiers, meta materials, gimbaling, and/or a directional antenna, for example. The transmission system 435 can create and transmit infrared, microwave, and/or optical signals that can be converted to energy in the receiving systems 410.

Other objects 445 in the volume 405 may or may not use energy from the wireless power system 400. Some objects can be RF transparent to permit radiofrequency energy to pass through. The wireless power system 400 can be implemented in any enclosed volume according to embodiments of the technology, or in other enclosed volumes. In some embodiments, the wireless power system can be deployed from a spacecraft body (see the body 350 in FIG. 3) after the membrane (315, see FIG. 3) deploys. In some embodiments, the transmission system 435 can communicate with the receiving systems 410 by modulating the radiofrequency energy to represent data, for example, by frequency modulation (FM), amplitude modulation (AM), phase modulation (PM), or by on-off keying (similar to Morse code).

Figure 5:
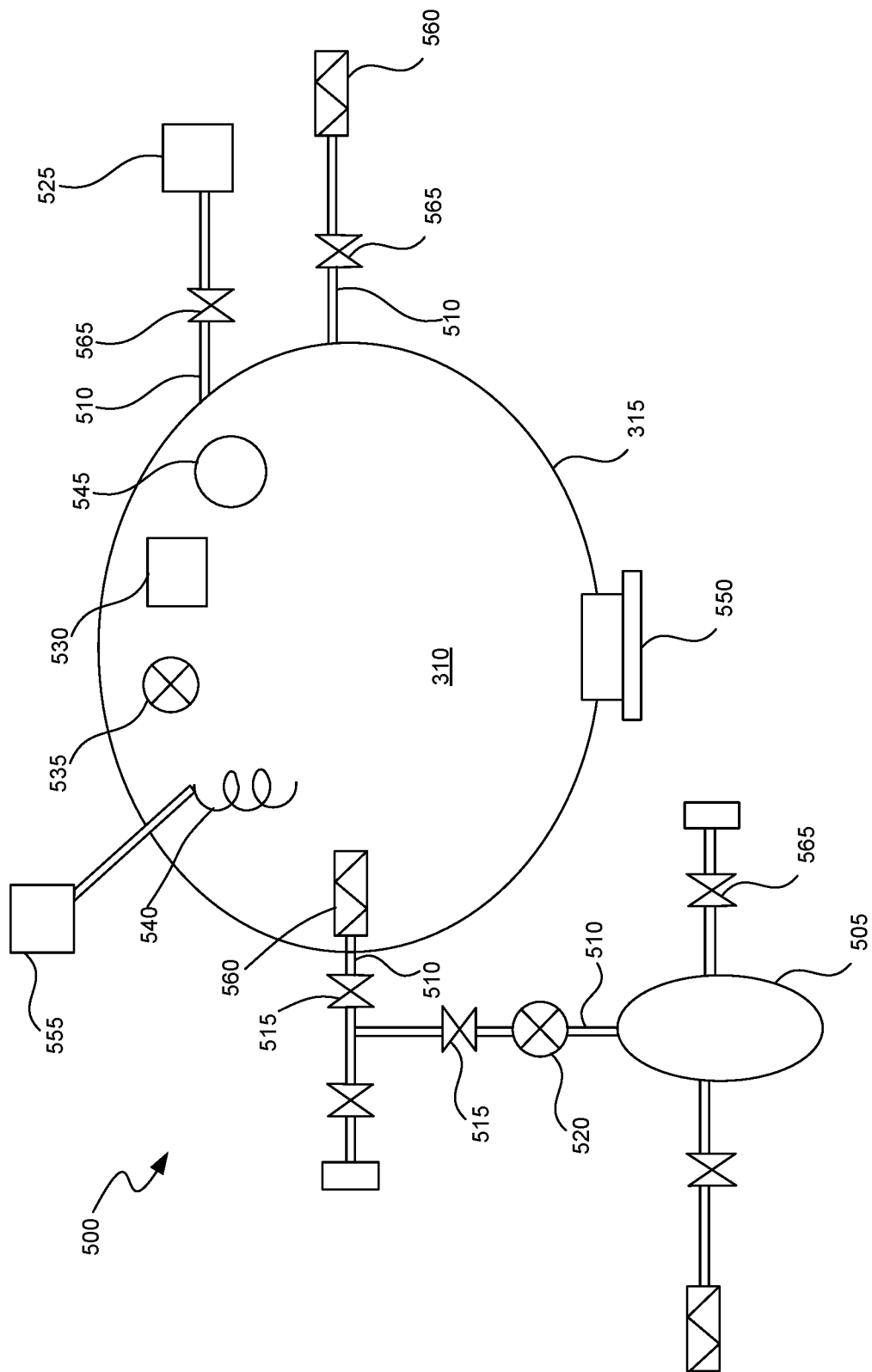
FIG. 5 illustrates a schematic view of a pressurization system for a membrane in accordance with embodiments of the present technology.

FIG. 5 illustrates a schematic view of a pressurization system 500 for pressurizing and/or tensioning a membrane (such as the membrane 315 described earlier) in accordance with embodiments of the present technology. The pressurization system 500 can be implemented in a spacecraft to pressurize one or more membranes. A fluid (e.g., gas or liquid) source 505, which can include a high-pressure cylinder or tank (and can be referred to as a reservoir), is connected to the enclosed interior volume 310 via one or more supply lines 510, which can be opened or closed with one or more valves 515. The supply lines 510 can be metal or plastic pipes, or other conduits suitable for sustaining pressure in a space environment and transporting fluid (e.g., gas or liquid).

In some embodiments, the fluid source 505 can include a liquid that transitions to gas when pressure is reduced. In some embodiments, the source 505 can be, or can include, a gas generator that produces gas from a chemical reaction between one or more constituent materials. In yet further embodiments, the fluid source 505 can include a system to produce gas or liquid for the enclosed interior volume 310 by electrolysis or pyrolysis. In some embodiments, the fluid source 505 can include a fluid (such as purified atmospheric air) at the ambient pressure of a launch site before a spacecraft carrying the pressurization system 500 is launched. For example, the source 505 can be pressurized to one atmosphere at launch. Upon reaching the vacuum of space, the pressure in the source 505 will then be significantly higher than the vacuum surrounding the membrane 315. Accordingly, the fluid can be released via the valves 515 and the supply lines 510 to fill the membrane 315. In some embodiments, one or more pumps 520 can be positioned along the supply lines 510 to assist with pressurizing the membrane 315. In some embodiments, the pumps 520 may function in reverse, to remove material from the membrane 315 to collapse the membrane 315 for storage and/or to otherwise adjust pressure in the membrane 315.

In some embodiments, one or more getters can be included in the system 500. A getter can remove unwanted gaseous components (e.g., pollutants such as hydrocarbons or materials outgassing from equipment) from the interior volume 310. For example, in a system with a transparent membrane 315, pollutants may discolor or otherwise soil the membrane 315. Pollutants can cause other problems. A getter can reduce (e.g., minimize or eliminate) such pollutants. In some embodiments, a getter 525 can be operatively connected to the interior volume 310 by a supply line 510. The getter 525 can include a chelator, ligand, clathrates, or it can be a chemical getter, or a cryogenic getter, for example. In some embodiments, a getter 530 can be positioned inside the interior volume 310.

A fan 535 can be positioned inside the membrane 315 in the volume 310 to circulate interior fluids, to assist with mixing gases, and/or to balance a thermal distribution of the materials in the volume 310.

In some embodiments, the pressurization system 500 can include a heater such as a heating element 540 to heat the material in the volume 310. The system 500 can include one or more sensors 545 mounted on walls in the volume 310 and/or in supply lines 510 to monitor environmental factors such as pressure, temperature, humidity, RF, magnetism, electrostatic forces, fluid composition, illumination levels, air currents, and/or other characteristics. In some embodiments, sensors 545 can be in or on the source 505, the getters 525, 530, an access port (described later), and/or in other portions of the system 500 suitable for providing measurement to monitor the health and performance of the system 500. An access port 550 can be positioned in the membrane 315 for ingress into and egress from the interior volume 310.

In some embodiments, a controller or control system 555 can be operatively connected to any portion of the pressurization system 500 to control, for example, the heater 540, the fans 535, the getters 525, 530, the source 505, and any valves or vents in the system 500. The control system 555 can receive input from the sensors 545 and adjust the system 500 accordingly.

In some embodiments, one or more diffusers 560 can be positioned on the ends of the lines 510 where gas or liquid is released from the lines 510. For example, a diffuser 560 within the membrane 315 reduces stress on the membrane 315 during the filling process by distributing the gas or liquid more evenly than if it were to be directly released from a single orifice. Diffusers 560 also reduce sound levels and distribute thermal loads. In some embodiments, diffusers 560 can be heated. In some embodiments, one or more diffusers 560 can be recessed into a portion of the membrane 315 to avoid obstructing activities inside the volume 310. In some embodiments, diffusers can be replaced with jets to create high velocity air currents in the volume 310.

One or more additional valves 565 can be operatively connected to the supply lines 510 to control venting of the membrane 315, access to the getter 525, and/or other aspects of the plumbing in the system 500.

C. Deployment and Operations

FIGS. 6A and 6B illustrate partially schematic top and side views, respectively, of a deployable space system 600 in a stowed configuration, in accordance with embodiments of the present technology. FIGS. 6C and 6D illustrate partially schematic top and side views, respectively, of a deployable space system 600 in a deployed (inflated) configuration in accordance with embodiments of the present technology. Together, FIGS. 6A-6D demonstrate a representative deployment process of the flexible membrane 315 and equipment associated with providing entertainment or other activities according to embodiments of the present technology.

Turning to FIG. 6A (with additional reference to FIGS. 6B-6D), the space system 600 can include a body 605 (which can be in the form of a plate, and can be referred to as a pressure chamber plate), which carries other components of the system 600. The body 605 can be a single-piece element or it can be formed with multiple portions. In some embodiments, the body 605 can be formed with metal, ceramic, plastic, and/or it can be formed with a three-dimensional printing process. The body 605 can form a mechanical interface between components of the system 600 and a spacecraft, such as a satellite. Accordingly, the system 600 can be carried by or installed in any suitable spacecraft. In some embodiments, the system 600 can be sized and shaped to fit in a CubeSat spacecraft. in other embodiments, the system 600 can be significantly larger than a CubeSat spacecraft. The system 600 can have any shape and size suitable for the types of entertainment and activities intended to occur in the interior volume 310.

As described earlier, membranes, such as the membrane 315, can be deployable and stowable (including stowage after deployment). The membrane 315 can be elastic or inelastic. It can have tie-down or connection points to the body 605 or can otherwise be deployably attached to the body 605, in a manner that forms a sealed interior volume 310 that can be pressurized when deployed. In some embodiments, the membrane 315 can be clamped, glued, welded, or brazed to the body 605. In some embodiments, the membrane 315 can be sufficiently elastic to maintain a tight seal around the body 605 before deployment (FIGS. 6A, 6B), and after deployment (FIGS. 6C, 6D). In some embodiments, an o-ring can surround the membrane 315 to form a seal between the membrane 315 and the body 605. The membrane 315 can be attached to the body 605 in any suitable manner that provides a structural connection with the body 605 and a seal sufficient to maintain pressure in the volume 310.

In some embodiments, when stowed, the membrane 315 can be rolled upon itself or collapsed upon itself in any suitable manner, including a random manner (for example, "scrunched up"). In some embodiments, when stowed, the membrane 315 can be partially or completely contained in a recess in the body 605 and restrained with a restraint and release device (similar to the manner in which drones and cameras are held in the body, as described later). In yet further embodiments, a stowed membrane 315 can be contained in a separate container attached to the body 605. FIGS. 6A and 6B illustrate schematic representations of the membrane 315 in the stowed configuration, in which it is connected to the body 605 but not yet inflated.

The membrane 315 can be deployed or pressurized in any suitable manner, for example using the pressurization system 500 described earlier with regard to FIG. 5. Although the membrane 315 can be flexible and deployable, in some embodiments it can be rigid and can always be in a deployed configuration (which can resemble the deployed configuration illustrated in FIGS. 6C and 6D). One or more inlets 607, controlled by optional valves 608, receive pressurized fluid to fill or otherwise deploy the membrane 315. The inlets 607 can receive gas or liquid from a supply line of a pressurization system (such as the supply line 510 shown in FIG. 5 between the source 505 and the interior volume 310 of the membrane 315).

The body 605 can include a receptacle, such as a drone holder 610, configured to hold one or more drones 615 (which can be similar to drones described earlier, and can be UAVs such as multicopters or other aerodynamically-propelled vehicles, or non-flying robots) during a launch phase of a space mission or during orbital maneuvers, and/or during other activities. The drone holder 610 can be configured to deploy the drones 615 on command (for example, a remote command or an autonomous command), in a timed sequence, or based on a trigger event, and/or for other events or reasons. In some embodiments, the body 605 can include multiple drone holders 610, each of which can carry and deploy one or more drones 615. FIGS. 6A and 6B show the drones 615 in a stowed configuration.

The drone holder 610 can hold the drones 615 in any suitable releasable manner. In some embodiments, one or more restraint and release devices 620 can hold the drones 615 until releasing them. Restraint and release devices 620 can include one or more flaps, latches, screws, burn-wires, pin-pullers, bolt-cutters, and/or tie-down straps. The restraint and release devices 620 are illustrated as flaps in FIG. 6A. Restraint and release devices 620 can hold the drones separately or in groups. Restraint and release devices 620 can be resettable by an operator or automatically, for example by returning a drone 615 to the drone holder 610 and restoring the stowed configuration of the devices 620.

In some embodiments, the body 605 can include camera holders 625, which can hold one or more cameras 630 in stowed configurations. In some embodiments, the camera holders 625 can include restraint and release devices similar to the restraint and release devices 620 for the drones 615, to hold and release the cameras 630. In some embodiments, one or more cameras 630 can be attached to the membrane 315 (for example, by a rear end of the cameras 630) to be deployed when the membrane 315 deploys. For example, FIG. 6B shows one camera 630a attached to the membrane 315, and FIGS. 6C and 6D show the camera 630a attached to the membrane 315 and deployed to view the interior volume 310. Accordingly, as shown in FIGS. 6C and 6D, one or more cameras can be carried by the membrane 315 itself. However, in other embodiments, other structures can support cameras 630. In some embodiments, optical elements of the cameras 630 can include one or more vents to release gas if the cameras are exposed to a vacuum.

In some embodiments, one or more cameras 630 may not be attached to the membrane 315 or may not deploy at all. For example, in some embodiments, the camera holders 625 can hold the cameras 630 throughout an activity, and/or a boom or other device can support one or more cameras 630. The discussion of holders and deployment of cameras 630 can also apply to lights, which can be stowed and deployed in a manner similar to the stowage and deployment of cameras.

In some embodiments, one or more springs or pusher plates can assist deployment of the drones 615 from the drone holder 610 or the cameras 630 from the camera holders 625. In other embodiments, gas released into the interior volume 310 (from the pressurization system 500 described above, for example) can assist deployment of the drones 615 or the cameras 630. For example, a diffuser or gas outlet can be positioned in the drone holders 610 and/or the camera holders 625.

The body 605 can include one or more access ports 635, which can include openings to provide access for equipment, materials, humans, human appendages (fingers, hands, arms, heads, or other appendages), robots, sensors, probes, cameras, wires, connectors, and/or other objects to pass between the inside and outside of the pressurized interior volume 310 (or into the body 605 if the membrane 315 is not deployed). The access ports 635 can be opened and closed using any suitable door or hatch mechanism (pneumatic, electric, magnetic, mechanical, manual, or other mechanisms). The system 600 can include a pressure equalization system such as a valve to equalize pressure between inside and outside of the interior volume 310. Access ports 635 can connect to each other to allow passage between interior volumes 310 of multiple membranes 315 and/or to hold two spacecraft together.

The overall system 600 can include a communications system 640, which can include an antenna 641, for providing communications for data, control, and/or other information. The communications system 640 can include a feedthrough connection 645 that can transmit communications signals between other systems outside of the space system 600 to the antenna 641. The feedthrough 645 can also transfer or transmit power, RF, thermal conductors, fluid, and/or other materials. The feedthrough 645 can be sealed to prevent leaks out of or into the interior volume 310.

In some embodiments, a wireless power system (such as the system 400 described earlier) can be included in the space system 600 to power the drones 615, and it can use the antenna of the communications system 640 and/or its own antenna.

With reference to FIGS. 6C and 6D, in particular, drones 615 can deploy from the drone holders 610 to carry out activities. Cameras can record or transmit audiovisual data of the activities. In FIGS. 6C and 6D, one camera 630a is shown deployed by the deployment of the membrane 315 and another camera 630 is shown retained in the camera holder 625 to provide a stationary viewpoint.

In operation, one or more launch vehicles can position a satellite having the system 600 in orbit, where the system 600 can deploy any relevant appendages (such as solar arrays, thermal radiators, and/or communication antennas), and where it can deploy the membrane 315 (for example, by opening an inlet valve 608 or by otherwise pressurizing the membrane 315). During or after deployment of the membrane 315, the restraint and release devices 620 can release the drones 615 from the drone holders 610. Likewise, the cameras 625 can deploy, such as by being carried into position by way of attachment to the membrane 315 or by other means. An activity, such as a drone battle, can take place. Upon completion of the activity, the drones 615 can return to the drone holders 610, the membrane 310 can be deflated and returned to a stowed position, and the mission can end. The process can repeat for future activities (for example, the membrane 315, drones 615, and/or cameras 630 can deploy and stow repeatedly). In some embodiments, the system 600 can be configured to be sufficiently large to accommodate humans and activities involving humans, such as concerts, competitive sports, or filmmaking.

Spacecraft according to embodiments of the technology can be used to facilitate any suitable game or activity. In addition to other sports that can be played in an arena (baseball, football, soccer, hockey, for example), spacecraft can be configured for games of: tag; laser tag; bumper cars (bumper drones); robotic games in which drones push, bump, or otherwise propel an object (such as a ball) into a space (such as an end-zone, net, or goal); robotic games in which a drone is propelled into a position (such as an end-zone or goal area); capture the flag; and/or king-of-the-hill (maintaining a position or trying to remove a player or drone form that position). An advantage of embodiments of the technology includes zero or low gravity versions of suitable games and contests that can be augmented with robotics, changing scenarios, and/or the general complications of operating in a space environment. Gameplay in space according to embodiments of the present technology can be a reward for victories in gameplay at lower levels.

Embodiments of the present technology provide facilities and equipment that enable entertainment in or from extraterrestrial environments, such as in orbit or on a planetary or lunar surface. In some embodiments, activities of spacecraft and related equipment described herein can be controlled by an on-board human, remotely, or autonomously. In some embodiments, artificial intelligence (AI) can be implemented to automatically communicate between spacecraft to control lighting, camera manipulation, drone activities, and/or navigation, for example.

From the foregoing, it will be appreciated that some embodiments of the present technology have been described herein for purposes of illustration, but various modifications can be made without deviating from the disclosed technology. For example, embodiments of the present technology can be scaled up or down in size, and/or can include any suitable type of drone or robot, or combinations of drones, robots, and humans to facilitate sports and activities. In some embodiments, cameras or other sensors can create a 3D model of an enclosed interior volume to map the volume for training or improved navigation by drones or humans. Although the disclosure refers to drones or UAVs in many instances, in suitable embodiments of the present technology, non-flying robots may be implemented, deployed, and/ or controlled in a similar manner as flying drones or UAVs. In some embodiments, humans may participate in activities with or against robots. Spacecraft according to embodiments of the present technology can form upper stage portions of launch vehicles and/or they can be payload on launch vehicles. Spacecraft and systems according to various embodiments may include gear for humans, including protective gear such as helmets, gloves, padding, shoes (for example, shoes with portions of hook-and-loop fasteners to attach to a surface in the spacecraft with corresponding portions of hook-and-loop fasteners), and/or body-mounted cameras, sensors, and/or other equipment to protect or improve the experience of a human onboard.

Certain aspects of the technology described in the context of some embodiments can be combined or eliminated in some embodiments. For example, the space system 600 described with regard to FIGS. 6A-6D can be carried in any suitable space vehicle and can be combined with any suitable pressurization system. Spacecraft in accordance with embodiments of the present technology can include upper stage portions of a launch vehicle, and they may be couple-able to a lower stage portion for launch into space.

Further, while advantages associated with some embodiments of the technology have been described in the context of those embodiments, some embodiments may also exhibit said advantages, and not all embodiments need necessarily exhibit such advantages to fall within the scope of the present technology. Accordingly, the present disclosure and associated technology can encompass other embodiments not expressly described or shown herein.

As used herein, the term "and/or" when used in the phrase "A and/or B" means "A, or B, or both A and B." A similar manner of interpretation applies to the term "and/or" when used in a list of more than two terms.

To the extent any of the materials incorporated herein by reference conflict with the present disclosure, the present disclosure controls.

I claim:

1. A method of operating a space system, the method comprising configuring one or more controllers to:
   in a first launch, launch a first spacecraft to a first orbit;
   in a second launch separate from the first launch, launch a second spacecraft to a second orbit, wherein the second orbit is different from the first orbit;
   move the first spacecraft to the second orbit from the first orbit;
   dock the first spacecraft with the second spacecraft in the second orbit; and
   transmit to a terrestrial location, using a plurality of cameras, an event or activity within an interior volume of the first spacecraft.

2. The method of claim 1, wherein the event or activity is a concert.

3. The method of claim 1, wherein the event or activity includes use of sports equipment.

4. The method of claim 1, further comprising configuring the one or more controllers to deploy a flexible membrane to form the interior volume in the first spacecraft.

5. The method of claim 1, further comprising configuring the one or more controllers to deploy one or more unmanned aerial vehicles (UAVs) within the interior volume.

6. The method of claim 1, further comprising configuring the one or more controllers to rotate the first spacecraft about one or more axes when the first spacecraft is in the second orbit.

7. The method of claim 1, further comprising configuring the one or more controllers to deploy a bulkhead to form the interior volume of the first spacecraft.

8. The method of claim 1, further comprising configuring the one or more controllers to operate lighting systems within the interior volume.

9. The method of claim 1, further comprising configuring the one or more controllers to operate a scoreboard.

10. The method of claim 9, wherein operating the scoreboard comprises displaying quantities, shapes, colors, and/or arrangements of lights.

11. The method of claim 1, wherein the first orbit is higher than the second orbit.

12. A method of operating a space system, the method comprising configuring one or more controllers to:
    launch a first spacecraft to a first orbit;
    launch a second spacecraft to a second orbit, wherein the second orbit is different from the first orbit;
    move the first spacecraft to the second orbit from the first orbit;
    dock the first spacecraft with the second spacecraft in the second orbit;
    rotate the first spacecraft about one or more axes when the first spacecraft is in the second orbit; and
    transmit to a terrestrial location, using a plurality of cameras, an event or activity within an interior volume of the first spacecraft.

13. A method of operating a space system, the method comprising configuring one or more controllers to:
    launch a first spacecraft to a first orbit;
    launch a second spacecraft to a second orbit, wherein the second orbit is different from the first orbit;
    move the first spacecraft to the second orbit from the first orbit;
    dock the first spacecraft with the second spacecraft in the second orbit;
    deploy a bulkhead to form an interior volume in the first spacecraft; and
    transmit to a terrestrial location, using a plurality of cameras, an event or activity within the interior volume in the first spacecraft.

14. The method of claim 13, wherein the method further comprises configuring the one or more controllers to deploy the bulkhead after moving the first spacecraft to the second orbit from the first orbit.

15. The method of claim 13, wherein deploying the bulkhead comprises deploying a porous bulkhead.

16. The method of claim 13, wherein deploying the bulkhead comprises deploying a transparent or translucent bulkhead.

17. The method of claim 12, wherein configuring the one or more controllers to rotate the first spacecraft about one or more axes comprises controlling spinning of the first spacecraft about the one or more axes to create centripetal force to simulate a gravitational force within the first spacecraft.

18. The method of claim 17, wherein the method further comprises configuring the one or more controllers to indicate, via at least one of lighting or a display, at least one of a spin direction or a direction of the simulated gravitational force.

* * * * *